United States Patent
Nielsen et al.

(10) Patent No.: US 9,268,215 B2
(45) Date of Patent: Feb. 23, 2016

(54) INJECTION MOLDING TOOLS WITH MICRO/NANO-METER PATTERN

(75) Inventors: Theodor Kamp Nielsen, Copenhagen N (DK); Brian Bilenberg Olsen, Ølstykke (DK); Jesper Nørregaard, Rødovre (DK); Anders Kristensen, Copenhagen Ø (DK); Kristian Smistrup, Copenhagen Ø (DK); Emil Søgaard, Valby (DK)

(73) Assignees: Danmarks Tekniske Universitet, Lyngby (DK); NIL Technology ApS, Kgs. Lyngby (DK)

(*) Notice: Subject to any disclaimer, the term of this patent is extended or adjusted under 35 U.S.C. 154(b) by 802 days.

(21) Appl. No.: 13/497,681

(22) PCT Filed: Oct. 1, 2010

(86) PCT No.: PCT/DK2010/050249
§ 371 (c)(1),
(2), (4) Date: Jun. 8, 2012

(87) PCT Pub. No.: WO2011/038741
PCT Pub. Date: Apr. 7, 2011

(65) Prior Publication Data
US 2012/0244246 A1   Sep. 27, 2012

Related U.S. Application Data

(60) Provisional application No. 61/257,191, filed on Nov. 2, 2009.

(30) Foreign Application Priority Data

Oct. 2, 2009   (DK) ................................. 2009 70145
Nov. 2, 2009   (EP) ..................................... 09174778
Nov. 24, 2009   (DK) ................................. 2009 70228

(51) Int. Cl.
*B29C 33/38* (2006.01)
*G03F 7/00* (2006.01)
(Continued)

(52) U.S. Cl.
CPC ............... *G03F 7/0002* (2013.01); *B82Y 10/00* (2013.01); *B82Y 40/00* (2013.01)

(58) Field of Classification Search
CPC .. B29C 45/263; B29C 45/2632; B29C 33/38; B29C 33/3842; B29C 33/3857; B29C 33/3878; B29C 33/3885; G03F 7/0002
USPC ......... 264/219, 220, 224, 225, 226, 227, 106; 425/175, 177, 179
See application file for complete search history.

(56) References Cited

U.S. PATENT DOCUMENTS 5,947,027 A   9/1999   Burgin et al.
6,173,925 B1   1/2001   Mueller et al.
(Continued)

FOREIGN PATENT DOCUMENTS

CN   101372547 A   2/2009
EP   1 422 194 A1   5/2004
(Continued)

OTHER PUBLICATIONS

IPIRA (Office of Intellectual Property & Industry Research Alliances), Univ. of California, Berkeley., abstract "Zero Residual Layer Nanoimprint Lithography", from webpage http://techtransfer.universityofcalifonia.edu/NCD/19159.html, printed on Oct. 14, 2009.
(Continued)

*Primary Examiner* — Timothy Kennedy
(74) *Attorney, Agent, or Firm* — Knobbe Martens Olson & Bear LLP

(57) ABSTRACT

The present invention relates to methods for embedded a micrometer and/or nanometer pattern into an injection molding tool. In a first main aspect, a micro/nanometer structured imprinting device is applied in, or on, an active surface so as to transfer the micro/nanometer patterned structure to the tool while the imprinting device is, at least partly, within a cavity of the injection molding tool. In a second main aspect, a base plate with a micro/nanometer structured pattern positioned on an upper part is positioned on the active surface within the tool, the lower part of the base plate facing the tool, the active surface receiving the base plate being non-planar on a macroscopic scale. Both aspects enable a simple and effective way of transferring the pattern, and the pattern may be transferred on the active working site of tool immediately prior to molding without the need for extensive preparations or remounting of the tool before performing the molding process.

11 Claims, 21 Drawing Sheets

(51) Int. Cl.
  *B82Y 10/00* (2011.01)
  *B82Y 40/00* (2011.01)

(56) References Cited

U.S. PATENT DOCUMENTS

| | | |
|---|---|---|
| 7,320,584 B1 | 1/2008 | Harper et al. |
| 2003/0006527 A1 | 1/2003 | Rabolt et al. |
| 2003/0017424 A1 | 1/2003 | Park et al. |
| 2005/0017404 A1 | 1/2005 | Youngs et al. |
| 2007/0138341 A1 | 6/2007 | Joshi et al. |
| 2007/0194178 A1 | 8/2007 | Lang |
| 2008/0084006 A1 | 4/2008 | Gao et al. |
| 2008/0122138 A1 | 5/2008 | Zhang et al. |
| 2009/0194913 A1 | 8/2009 | Chang et al. |

FOREIGN PATENT DOCUMENTS

| | | |
|---|---|---|
| EP | 1 700 680 A1 | 9/2006 |
| EP | 1 731 965 A2 | 12/2006 |
| EP | 1 925 779 A1 | 5/2008 |
| WO | WO 02-07199 A1 | 1/2002 |
| WO | WO 2006-026993 A1 | 3/2006 |
| WO | WO 2009-028745 | 3/2009 |

OTHER PUBLICATIONS

Anonymous: "Use of air pressure in an imprint method", Research Disclosure, Mason Publications, Hampshire, GB, vol. 493, No. 74, May 1, 2005 (XP007135109).

Li et al., "Patterning Curved Surface Using Hybrid Nanoimprint-soft Lithography Mold".

Plachetka et al., "Wafer scale patterning by soft UV-Nanoimprint lithography", ELSEVIER, Microelectric Engineering 73-74 (2004), pp. 167-171.

Pranov H. et al., "On the injection molding of nanostructured polymer surfaces", Polymer Eng. & Sci., Feb. 2006, 2, p. 160-170.

INJECTION MOLDING TOOLS WITH MICRO/NANO-METER PATTERN

CROSS REFERENCE TO RELATED APPLICATIONS

This application claims the benefit and priority to and is a U.S. National Phase Application of PCT International Application Number PCT/DK2010/050249, filed on Oct. 1, 2010, designating the United States of America and published in the English language, which is an International Application of and claims the benefit of priority to Danish Patent Application No. PA 2009 70145, filed on Oct. 2, 2009, U.S. Provisional Application No. 61/257,191, filed on Nov. 2, 2009, European Patent Application No. 09174778.2, filed on Nov. 2, 2009, and Danish Patent Application No. PA 2009 70228, filed on Nov. 24, 2009. The disclosures of the above-referenced applications are hereby expressly incorporated by reference in their entireties.

FIELD OF THE INVENTION

The present invention relates to methods for embedded a micrometer and/or nanometer pattern into an injection molding tool. The invention also relates to a corresponding injection molding tool.

BACKGROUND OF THE INVENTION

The principle of injection molding is apparently simple: Melted polymer is used to fill up a mold for the fabrication of a part. In reality, it is a complex process with many parameters. The basic process is: 1) injection of liquid polymer into the mold 2) cooling so the polymer solidifies, and 3) de-molding of the part. An injection molding machine converts thermoplastic granular or pellets into finished parts.

An injection mold is also known as a molding tool, and typically it has an exchangeable mold cavity. This prolongs the tool life, since only the cavity need replacement when the mold cavity is worn out.

Nanostructures may already be injection molded on 2D surfaces e.g. in the production of Blu-ray disc and DVDs. However, the current structure size limit for so-called free-form injection molding is approximately 50 µm. Free form surfaces are generally designed using computer aided design (CAD) techniques, and are usually not bound by rigid radial coordinates like planes, cylinders, conic surfaces, etc. Thus, there is a need for a more advanced injection molding techniques capable of molding constructional details below the effective 50 µm limit.

WO 2009/028745 (to LG Electronic Inc.) discloses an injection-molding apparatus. The injection-molding apparatus comprises: a mold having a cavity; a core mold having a core surface to form a molding space for injection moldings when being joined to the cavity mold; a heating unit for heating the cavity mold or the core mold; a cooling unit for cooling the cavity mold or the core mold; and a patterning stamp having a micrometer or nanometer sized pattern and provided on an inner surface of the molding space. A micrometer or nanometer sized pattern is formed on a surface of injection moldings so as to have a super-hydrophobic characteristic and an optical characteristic, and a micrometer or nanometer sized pattern of a complex structure can be implemented by placing the patterning stamp inside the mold cavity.

However, this molding apparatus is inherently limited to patterning stamps that are prepared outside of the molding apparatus, and subsequently inserted into the dedicated position within the molding tool and is limited to micro- and nanometer patterning of planar or simple curved surfaces (bend planes like cylinders). This, in turn, also limits the available forms that are possible to pattern because of the high pressure and/or high temperature in an injection molding system when molding. Thus, more complex forms are not easily patterned by this method. Accordingly, the disclosed method is rather inflexible due to limited forms available.

Hence, an improved injection molding tool would be advantageous, and in particular a more efficient and/or reliable molding tool would be advantageous.

Object of the Invention

It is a further object of the present invention to provide an alternative to the prior art.

In particular, it may be seen as an object of the present invention to provide a injection molding tool that solves the above mentioned problems of the prior art with micrometer and/or nanometer patterns in complex geometries or on so-called freeform surfaces inside the cavity of the mold.

SUMMARY OF THE INVENTION

Thus, the above described object and several other objects are intended to be obtained in a first main aspect of the invention by a method for manufacturing a micro/nanometer-structured pattern in, or on, the active surface of an injection molding tool, the method comprising:

providing the injection molding tool;
  providing a micro/nanometer structured imprinting device having a structure to be imprinted in said tool; and
  applying the imprinting device in, or on, the said active surface so as to transfer the micro/nanometer patterned structure to the tool while the imprinting device is, at least partly, within a cavity of the injection molding tool.

The invention is particularly, but not exclusively, advantageous for providing a method for micro/nano-meter patterning of injection molding tools that enables a simple and effective way of transferring the pattern. It is yet another advantage that the pattern is transferable on the active working site of tool i.e. the pattern may embedded immediately prior to molding opening without the need for extensive preparations or remounting of the tool before performing the molding process. This may facilitate applications and/or functionalities of molded part in various news and/or surprising fields, cf. Annex 1 and Annex 2 for lists of such fields.

In an embodiment, the active surface being imprinted with the micro/nanometer pattern may be non-planar on a macroscopic scale. The concept of a macroscopic scale may be defined as the length scale where objects and processes are measurable and observable with the naked eye of a person with normal vision. More specifically, the macroscopic scale may be defined tentatively as a length above approximately 1 millimeter (mm), cf. Definition paragraph below.

The concept of non-planar may be considered from a mathematical point of view as a deviation from the plane, but non-planar should further be considered in light of the macroscopic scale, i.e. around 1 mm. A more quantitative concept of non-planar is introduced below in the Definition paragraph. More specifically, the active surface being imprinted with the micro/nanometer pattern may be curved on a macroscopic scale, e.g. of an approximate cylindrical, conical, or circular shape.

Preferably, the application of the imprinting device may be performed when the injection molding tool is in an assembled form, said assembled form being ready, or substantially ready, for injection molding. This may be distinguished from other available techniques for surface patterning of injection molding tools that requires the active surface portion to be separate from the tool itself. One example is the method of WO 2009/028745 (to LG Electronic Inc.) which requires an insertable stamp plate for patterning.

Preferably, the micro/nanometer patterned structure may be permanently transferred to the tool. This may be performed by for example laser-assisted direct imprinting (LADI). The term "permanently" meaning being substantially inseparable from the tool, and/or the nano/micrometer structure forming an integral part of the material of the tool surface, e.g. steel.

Alternatively or additionally, the micro/nanometer pattern may be imprinted directly in, or on, the tool. This may require special tool and/or a special surface to be possible.

Alternatively, the micro/nanometer pattern may be initially imprinted in a preparation layer, the preparation layer subsequently being processed to form the desired pattern. The preparation layer may for example be a resist, which is then electroplating, etc., cf. detail description below. The preparation need not be imprinted in an insertable stamp, because the process can be embedded in the mold itself. It should be noted that the resist layer can be deposited before imprinting, or alternatively the resist layer can be attached on imprinting device. As a special preparation layer hybrid-polymer like HSQ can be used; after deposition the hybrid-polymer is heated to from a porous glass structure. The heating can for example be performed be using heating means in the injection molding tool, or in the surrounding molding system.

Advantageously, the imprinting device may comprise a first and a second cavity, the first and the second cavity being separated by a flexible intermediate member within the imprinting device, the intermediate member comprising a stamp with a micro/nanometer imprinting pattern. Additionally, the method may further comprise positioning the imprinting device on the tool so as to form a substantially air-tight enclosure within the second cavity, the enclosure being defined at least by the corresponding tool surface and the flexible intermediate member, and changing the relative pressure between the first and the second cavity so as to cause a decrease in the volume of the second cavity by displacing the flexible intermediate member towards the tool surface and thereby imprinting the micro/nano-meter pattern in, or on, the tool.

Preferably, the imprinting device may have a container-like form with an open end to be positioned on the tool, the open end defining said corresponding tool surface.

Further, sealing means may be provided on a portion of the imprinting device facing the tool to be imprinted, the sealing means being arranged for, in combination with the tool surface, to provide a substantially air-tight sealing of the said second cavity.

In a second main aspect, the present invention relates to a method for manufacturing a micro/nano-meter patterned structure in, or on, the active surface of an injection molding tool, the method comprising:
  providing a tool;
  providing a base plate, the base plate having a micro/nanometer structured pattern positioned on an upper part,
  positioning the base plate on the active surface within the tool, the lower part of the base plate facing the tool, and
  securing the position of the base plate within the tool.
wherein the active surface receiving the base plate is non-planar on a macroscopic scale.

The invention is particularly, but not exclusively, advantageous for providing a method for micro/nano-meter patterning of injection molding tools that enables a simple and effective way of transferring the pattern on non-planar surfaces of injection molding tools, especially complex and/or large tools that might not otherwise have an embedded micro/nano-meter pattern.

Under some circumstance, the step of positioning and the step of securing the base plate on the active surface may essentially be performed in one and the same process, e.g. the positioning of the base plate may be finalized so as to secure the positioning of the base plate, for example by plastic deformation of the base plate and/or the active surface of the injection molding tool.

In an embodiment, the active surface being imprinted with the micro/nanometer pattern may be curved on a macroscopic scale. The concept of a macroscopic scale may be defined as the length scale where objects and processes are measurable and observable with the naked eye of a person with normal vision. More specifically, the macroscopic scale may be defined tentatively as a length above approximately 1 millimeter (mm), cf. Definition paragraph below. The active surface being imprinted with the micro/nanometer pattern may be curved e.g. of an approximate cylindrical, conical, or circular shape.

Advantageously, the base plate may be deformable according to the shape of active surface of the injection molding tool, preferably by plastic deformation i.e. irreversible reshaping the plate. Typically, the base plate may comprise metal, e.g. steel, aluminum, nickel, etc.

The positioning of the base plate may for example be performed by a relative overpressure acting from the side of the upper part of base plate. Preferably, the overpressure is provided by an injection molding system working in cooperation with the injection molding tool, preferably as an injection molding process e.g. an initial running of the molding process.

Alternatively, the positioning of the base plate may be performed by a relative underpressure acting from the side of the lower part of base plate, i.e. a drawing solution.

Additionally or alternatively, the positioning of the base plate onto the active surface may be assisted by guiding means, e.g. rails or pins guiding the plate in position.

In yet another aspect, the invention relates to an injection molding tool comprising a micro/nano-meter patterned structure in, or on, the active surface of an injection molding tool, the structure being transferred according to the method of the first main aspect, or according to the method of the second main aspect. Though the present invention according to the first and second main aspects above is related to an injection molding tool, it is contemplated that the invention may also be applied in the context of casting tools.

The individual aspects (both first and second main aspects, and individual aspects listed in Annex 1 and Annex 2) of the present invention may each be combined with any of the other aspects. These and other aspects of the invention will be apparent from the following description with reference to the described embodiments.

DEFINITIONS

Injection molding may be considered to be constituted by at least three steps:
1) injection of liquid polymer into the mold,
2) cooling so the polymer solidifies, and
3) de-molding of the part.

An injection molding machine, in short, converts thermoplastic granular or pellets into finished, molded parts. Some examples of injection molding include, but are not limited to;
  In-mold decoration and in mold lamination
  Injection-compression molding
  Low-pressure injection molding
  Lamellar (microlayer) injection molding
  Microinjection molding
  Film insert molding
  Blow molding Active surface of an injection molding tool is, in the present context, considered to be the inner surface of a molding tool, which will correspondingly form the outer surface of the molded product or part. The active surface may be positioned either on the so-called core mold, or the so-called cavity mold, typically applied in mating relationship of an injection molding tool.

A cavity of the injection molding tool may be defined as the space forming the final molded part. Text book definitions within this field also define a "cavity" as the space inside a mold into which polymer material is injected. Thus, the molding tool when in a closed molding configuration defines the cavity, or cavity space.

When imprinting a pattern in the molding tool, the tool will be in an open configuration. The imprinting device is therefore, at least partly, within the cavity of the molding tool. The molding tool will typically be in an open configuration when being imprinted according to first and second main aspect of the present invention to allow access to the active surface.

Non-planar is considered non-planar on a macroscopic scale, the latter may be considered to be a scale above approximately 10, 50, 100, 500, or 1000 micrometer (μm) in the context of the present invention.

By non-planar surface is meant a surface with a radius of curvature or multiple radius of curvatures equal to or less than 5, 8, 12, 16, or 20 meter (m) in any one or multiple directions.

The radius of curvature of a surface is given by the corresponding circle radius r. The flatness of for example silicon wafers is typically given as a total thickness variation (TTV) parameter which typically is 5-10 μm. If one assumes that the TTV is a pure bending of the surface meaning that the TTV number represents the height difference (+/−) between the edges of the wafer and the center of the wafer—the TTV number can be directly related to the surface's radius of curvature:

$$TTV = r - (r^2 - c^2)^{0.5}$$

where c is radius across the silicium wafer. Thus for a 4 inch Si wafer (approximately c=50 mm) a radius of curvature of 125 m corresponds to TTV=10 μm, and r=250 m corresponds to TTV=5 μm.

Remarks about ANNEX 1 and 2

Priority applications of Danish patent application PA 2009 70145 (2 Oct. 2009), and Danish patent application PA 2009 70228 (24 Nov. 2009) form the basis of Annex 1.

Priority applications of European application No. 09174778.2 (2 Nov. 2009) and U.S. provisional application 61/257,191 (24 Nov. 2009) form the basis of Annex 2, the two applications being identical.

The Figures referred to in Annex 2 are used in two ways;
1) illustrating the invention for embedding micro/nano-meter pattern into an injection molding tool, cf. "Detailed description" below, and
2) illustrating the invention in a more general formulation for embedding a micro/nano-meter pattern into a more general object, preferably of a complex shape, cf. Annex 2, "Detailed description of an embodiment".

BRIEF DESCRIPTION OF THE FIGURES

The invention will now be described in more detail with regard to the accompanying figures. The figures show one way of implementing the present invention and is not to be construed as being limiting to other possible embodiments falling within the scope of the attached claim set.

FIGS. 1-3 are schematic side-view illustrations showing a preferred embodiment of the first main aspect of the present invention, FIG. 4 is a schematic drawing of an imprinting device according to the present invention, FIG. 5 shows various embodiments for sealing means according to the present invention, FIG. 6 shows two different flexible intermediate members according to the present invention, FIGS. 7-13 schematically show various embodiments for implementing the present invention in an injection mould form, FIG. 14 schematically shows a flexible imprinting stamp according to the present invention, FIG. 15 is a conceptual drawing for an application of the present invention in an insert of an injection moulding form, FIG. 16 is a flow chart of a method according to the invention, FIGS. 17 and 18 are general schematic illustrations according to the second main aspect of the present invention, FIGS. 19 and 20 are more specific illustrations of an embodiment according to the present invention, and FIG. 21 is a flow chart of a method according to the invention.

DETAILED DESCRIPTION

Figure 1:
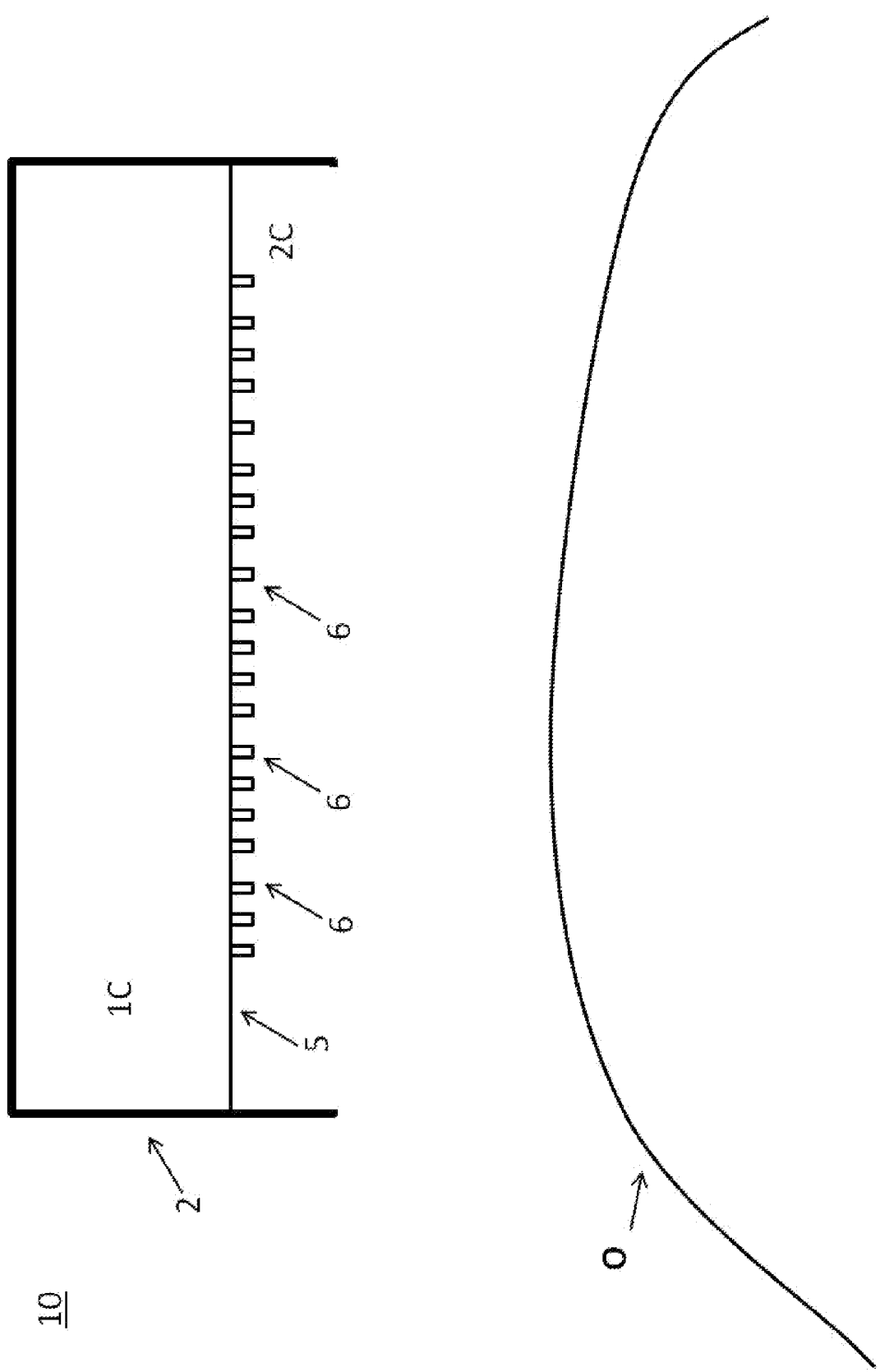
FIGS. 1-17 relate to the first main aspect of the present invention.

FIG. 1 is schematic side-view illustration showing a preferred embodiment of the invention i.e. a method for imprinting a micro/nano-meter pattern in or on an injection molding tool O. The form and structure of the imprinting device 10 is not limited to this particular shape but many different shapes and forms of the container or vessel-like structure 2 may be readily used within the teaching and principle of the invention. In a top-view (i.e. orthogonal to the side view) the imprinting device 10 may be circular, rectangular, quadratic, elliptic, or any desirable form suitable for implementing the invention. The imprinting device 10 may similarly have a non-planar rim depending on the specific surface shape of the injection molding tool O where the micro/nano meter pattern 6 will be imprinted.

The imprinting device 10 comprises a first cavity 1C and a second cavity 2C, the first and the second cavity being separated by a flexible intermediate member 5 within the imprinting device 10, the intermediate member comprising a stamp, or a stamp portion, with a micro/nano imprinting pattern 6. The imprinting device has a container-like form 2 with an open end to be positioned on the injection molding tool O, the open end defines a corresponding injection molding tool surface, cf. FIG. 2.

The imprinting pattern or features 6 are not drawn to scale but are merely shown to indicate the principle of the invention. It should be noted the pattern or features 6 as such may also be positioned on top of protrusions on the stamp or stamp portions, these protrusion are often called mesa structures within micro/nano lithography.

Figure 2:
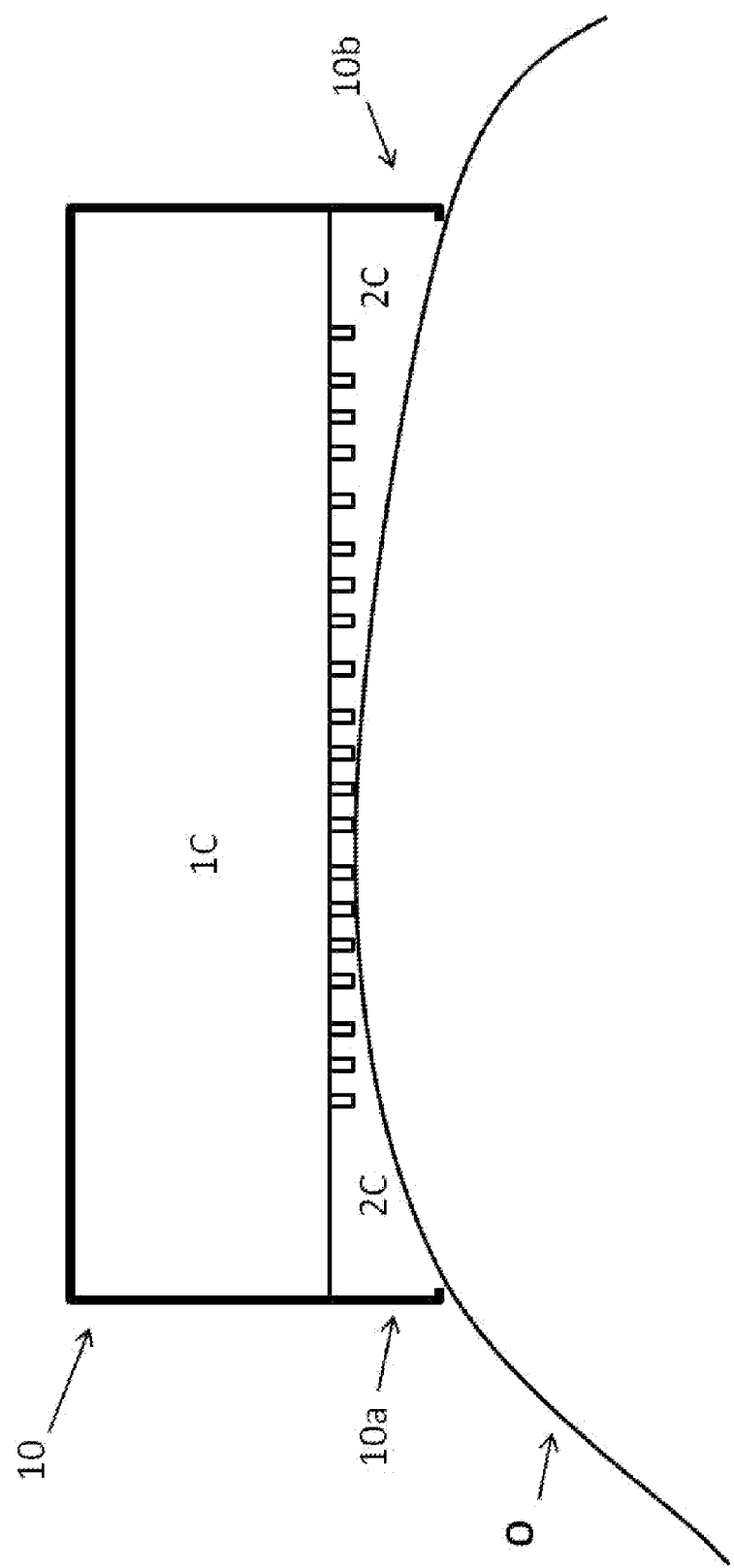

In FIG. 2, the imprinting device 10 is positioned on the injection molding tool O (either by moving the injection molding tool O, and/or, equivalently, moving the device 10). The device 10 is positioned on the injection molding tool O so as to form a substantially air-tight enclosure within the second cavity 2C, the enclosure being defined at least by the corresponding injection molding tool surface within the cavity 2C and the flexible intermediate member 5, and as shown in embodiment in the Figure; also part of the side walls 10a and 10b of the device 10. In an alternative embodiment, the member 5 may be attached to the lowermost part of the sidewalls 10a and 10b so that the enclosure is defined only be the member 5 and the corresponding injection molding tool surface.

Figure 3:
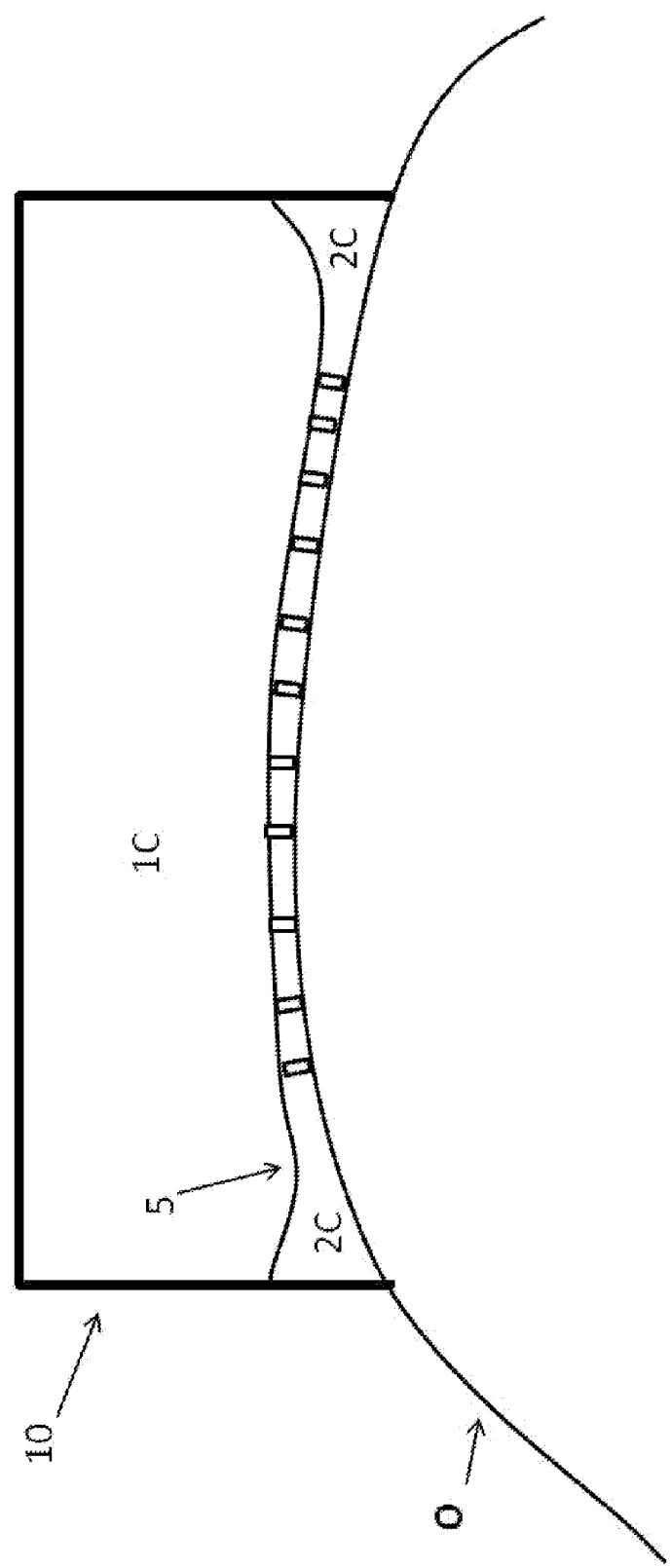

In FIG. 3, it is illustrated how changing the relative pressure between the first cavity 1C and the second cavity 2C causes a decrease in the volume of the second cavity by displacing the flexible intermediate member 5 towards the surface of injection molding tool O and thereby imprinting the micro/nano-meter pattern 5 in the injection molding tool. It should be noted that for various applications the micro/nano-meter pattern 5 may alternatively be imprinted in a preparation layer (not shown here) on top of the injection molding tool O, for example a photo resist layer (UV curable or similar), a thermoplastic layer, hybrid polymer (e.g HSQ or Ormocer), or any other intermediate layer suitable for transferring a pattern into a injection molding tool O by surface modifications technologies well-known to the skilled person. Some examples are given in connection with FIGS. 7-13, cf. below.

In FIG. 3, it is apparent the imprinting device forms a stacked structure with the first cavity 1C on top followed by member 5, the second cavity 2C, all three positioned above the injection molding tool O, though a portion of the injection molding tool O may extend into the second cavity 2C due to the curved surface of the injection molding tool O.

From the embodiment shown in FIG. 3, it is also evident that the changing of the relative pressure between the first and the second cavity results in a decrease in the volume of the second cavity 2C, and causes a corresponding increase in the volume of the first cavity 1C because the member 5 is displaced downward for imprint.

The changing of the relative pressure between the first cavity 1C and the second cavity 2C is typically performed by increasing the pressure in the first cavity, and simultaneously decreasing the pressure in the second cavity. Alternatively, the change is implemented by decreasing the pressure in the second cavity 2C last.

The change of relative pressure may be implemented by various pressure changing means readily available and well-known to the skilled person. Thus, in one embodiment pressure changing means may be connected pumps (not shown) but other variants may include changing the volume of the cavities by physical means, e.g. moving sides/wall, integrated pistons, etc. Also integrated volume changing means such as heaters, coolers, chemical reactants capable of increasing or decreasing the gas volume may be implemented within the teaching and principle of the present invention.

In an even further variant of the invention, it is contemplated that the first cavity 1C comprises force providing means or generators that may provide a force on the member 5 and the change in relative pressure may be then be the result of a decreasing pressure in the second cavity 2C. The force provided should thus results in the displacement of the imprinting member 5 to the surface of the injection molding tool O. Such force providing means or generators may include springs, resilient means (rubber or polymers), actuators (electrical, pneumatic, hydraulic), etc.

Figure 4:
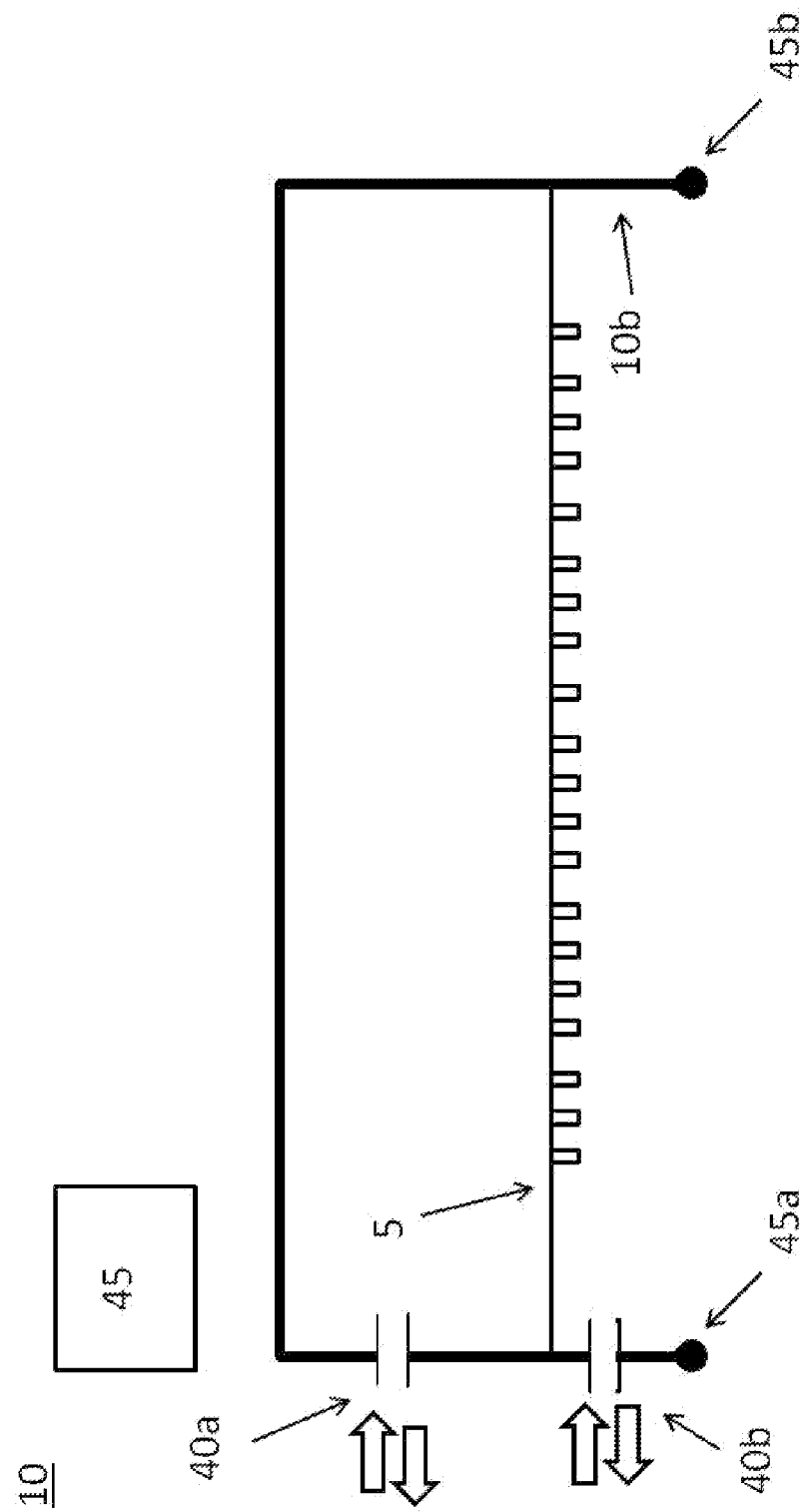

FIG. 4 is a schematic drawing of an imprinting device according to the present invention. Changing the relative pressure between the first cavity 1C and the second cavity 2C may be implemented with one or more fluid channels in the imprinting device 10 for conveying fluid to and/or from the first and/or the second cavity. In FIG. 4, one fluid channel is provided for each of the first and the second cavity, channel 40a and channel 40b, respectively. As schematically indicated by double arrows in front of each channel, the channels are used for pumping fluid, i.e. gas or liquid, into and/or out of the first and the second cavities so as to cause a decrease in the volume of the second cavity 2V by displacing the flexible intermediate member 5 towards the injection molding tool surface and thereby imprinting the micro/nano-meter pattern in or on the injection molding tool (not shown here).

The fluid flows are controllable from the control unit 45, and optional pressurizing means (e.g. pumps or similar means) may be controlled there from.

The change in the relative pressure should take into account the clearance, i.e. the available vertical displacement, of the flexible member 5 to allow the member to reach the surface of the injection molding tool. The clearance of the member 5 is related to the mechanical parameters of the member, e.g. the rigidity and the dimensions.

In one special embodiment, there could be just one or more fluid channels into the second cavity 2C. The pressure from above (i.e. from the first cavity) could be set from manufacturing in air-tight enclosure, or alternatively, force providing means or generators could be provided in the first cavity 1C as explained above.

On the lower part of the sides 10a and 10b, sealing means 45a and 45b are provided on a portion of the imprinting device facing the injection molding tool O to be imprinted, the sealing means 45 being arranged for, in combination with the injection molding tool surface, to provide sealing of the second cavity 2C to form an air-tight enclosure therein.

Figure 5:
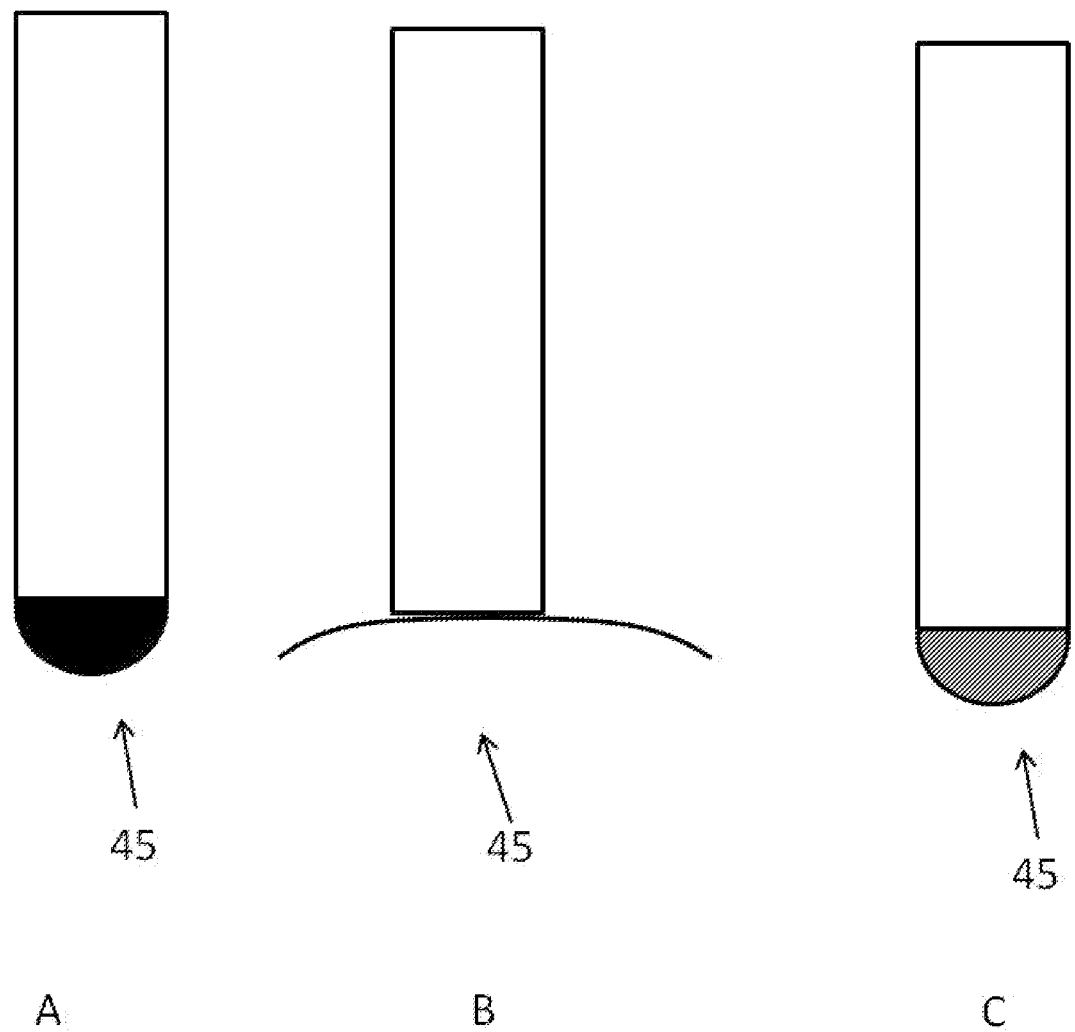

FIG. 5 shows various embodiments for sealing means according to the present invention are shown in schematic cross-sectional drawings.

In part A, a resilient portion, e.g. of rubber, is provided on the rim with a half-circular cross-section that may easily adapt to various complex shapes of the injection molding tool O to be imprinted on.

In part B, a sucking disc is provided on the rim in order to provide firm gripping onto various complex shapes of the injection molding tool O to be imprinted on.

In part C, a fluid portion is provided on the rim with a half-circular cross-section that may also easily adapt to various complex shapes of the injection molding tool O to be imprinted on and simultaneous form a substantially airtight enclosure within the second cavity 2C.

Figure 6:
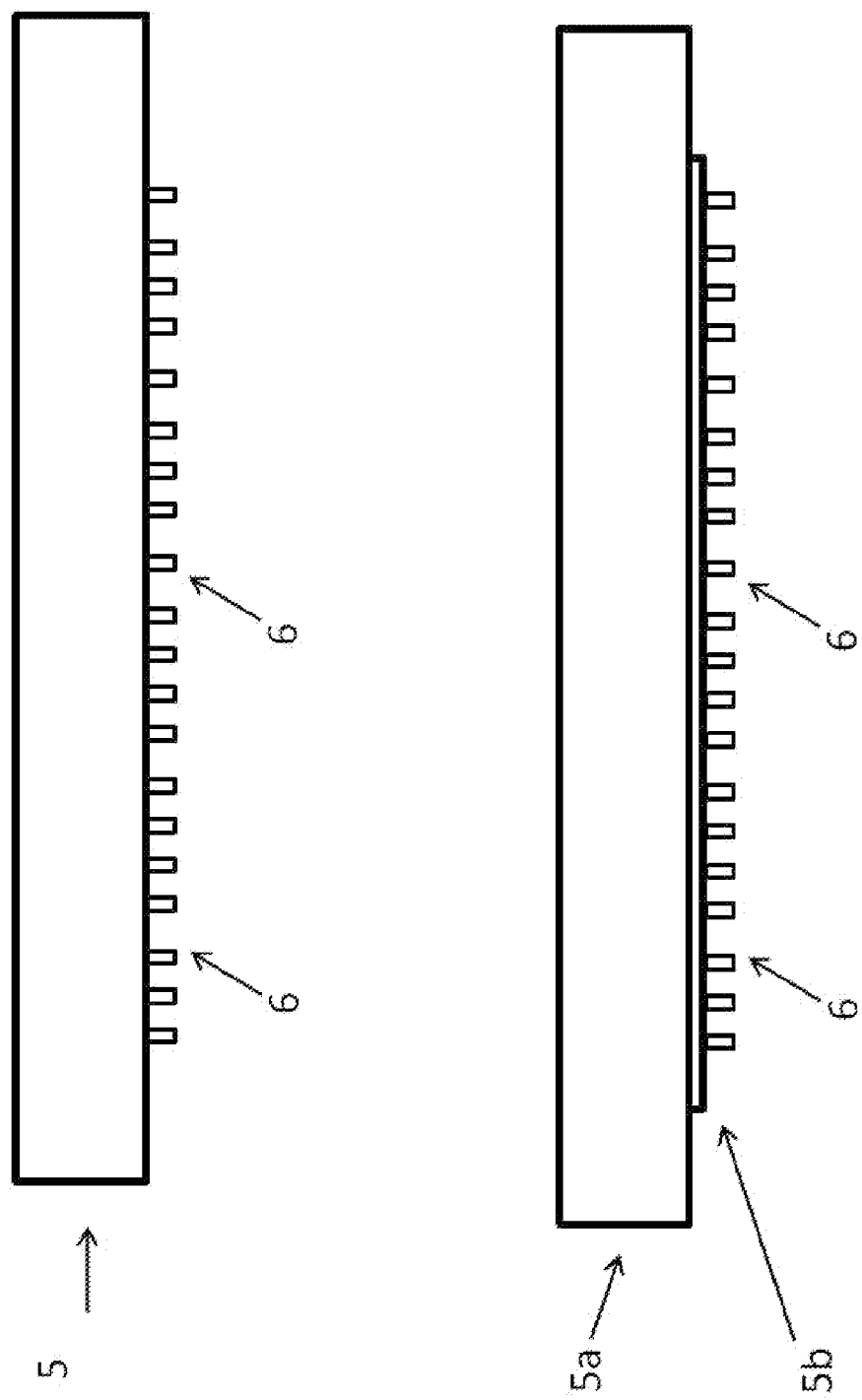

FIG. 6 shows two different flexible intermediate members 5 according to the present invention.

The flexible intermediate member 5 is attached to the internal sides of the imprinting device, preferably along the entire periphery to create an air-tight sealing, and therefore appropriate connection or fixation means (not shown) may be present on or in the member 5 and/or on the inside parts of the device 10. The connection or fixation means may be of permanent (many time use) or temporal (single or few time usages) character.

As shown in FIG. 6, upper part, the flexible intermediate member 5 is typically a polymer membrane but could also be made of other flexible materials, e.g. a thin silicon (Si) wafer. Generally, various materials like nickel alloys, steel, aluminum alloys may be applied, preferably a material which is relatively easy to deform. Could also be combinations, such as glass structures or metal structures on a deformable polymer base, or a material with a shim. The stamp part with the imprinting pattern or features 6 is then formed in or on the polymer membrane 6 as an integral part of the membrane 5.

Alternatively, the stamp 5b is attached to the flexible membrane 5a, preferably releasably attached to the membrane, e.g. a Si stamp 5b can be mounted on the polymer membrane 5a. Alternatively, a polymer stamp 5b can be mounted on a Si membrane or wafer with the required flexibility.

FIGS. 7-13 schematically show various embodiments for implementing the present invention in an injection mould form or casting mould 70, or parts thereof e.g. inserts. For simplicity of the Figures, only the intermediate member 5 is the only part of the imprinting device 10 which is shown.

Figure 7:
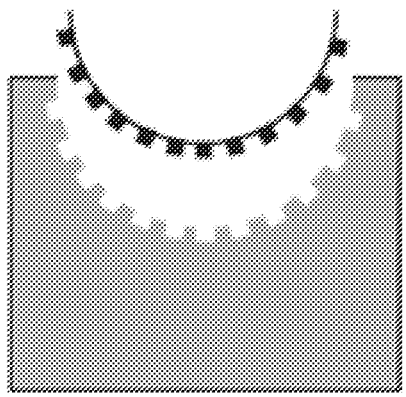
Figure 7:
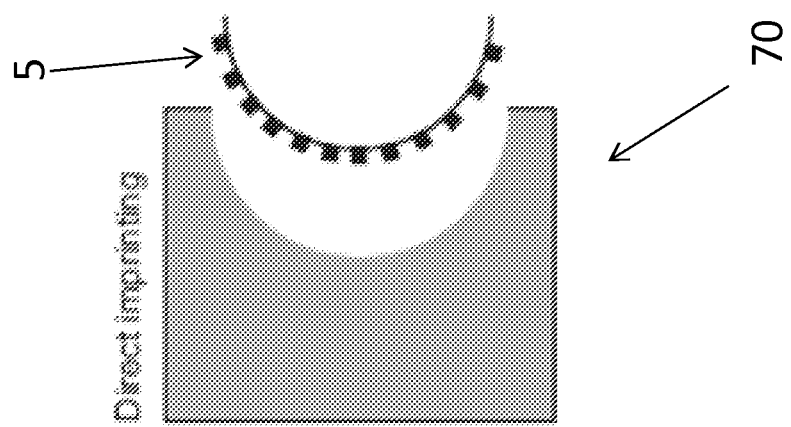

FIG. 7 shows a so-called direct imprinting where the flexible member 5 of the imprinting device (as mentioned not shown in whole for simplicity) is imprinting directly into a mouldable layer in the form or mould. This may be achieved by heating the relevant surface part of the mould or similar measures. To the right, the pattern is shown in the mould.

Figure 8:
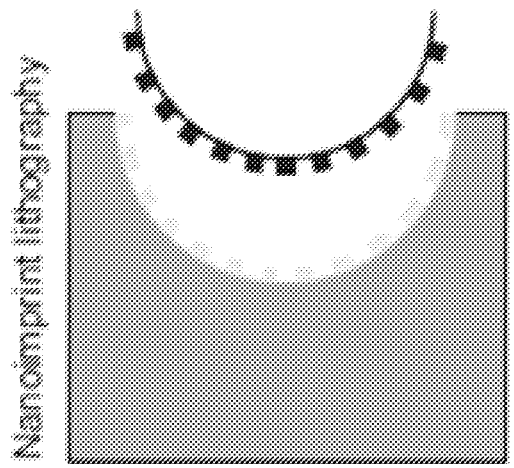
Figure 8:
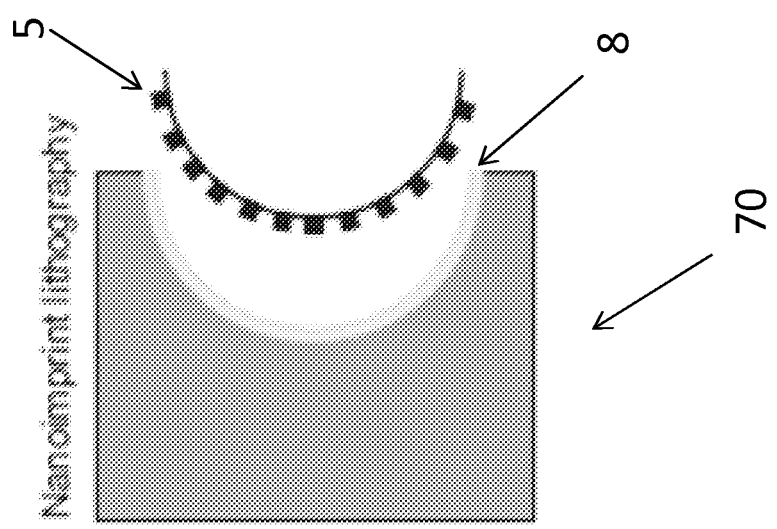

FIG. 8 shows a nanoimprint lithographic method where a preparation layer 8 is present, e.g. a polymer being thermoplastic, thermosetting, sol-gel, or UV-curable (requires dedicated UV lamps, not shown). For the thermoplastic and thermosetting layers, heating such as platform heater, infrared heater, high frequency induction heater, UV illuminator, and halogen lamp or other heating means may be provided. The fluids entering the first and/or second cavity may be heated additionally or alternatively.

Figure 9:
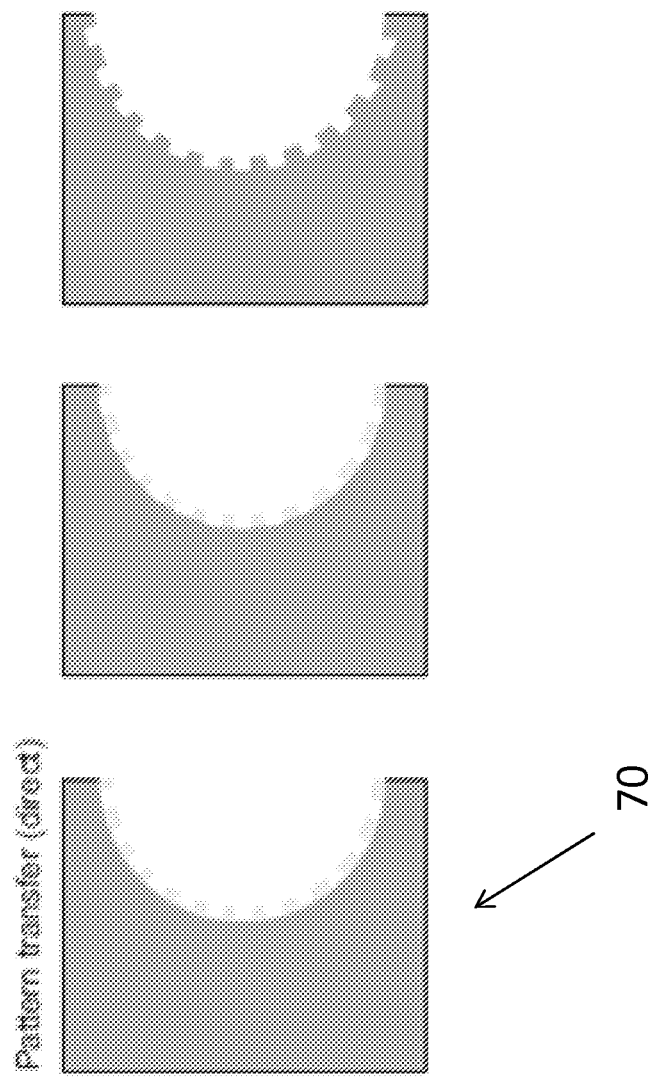

FIG. 9 schematically shows a pattern transfer method where polymer residues are removed and the pattern is for example etched into the surface of the tool/insert 70.

Figure 10:
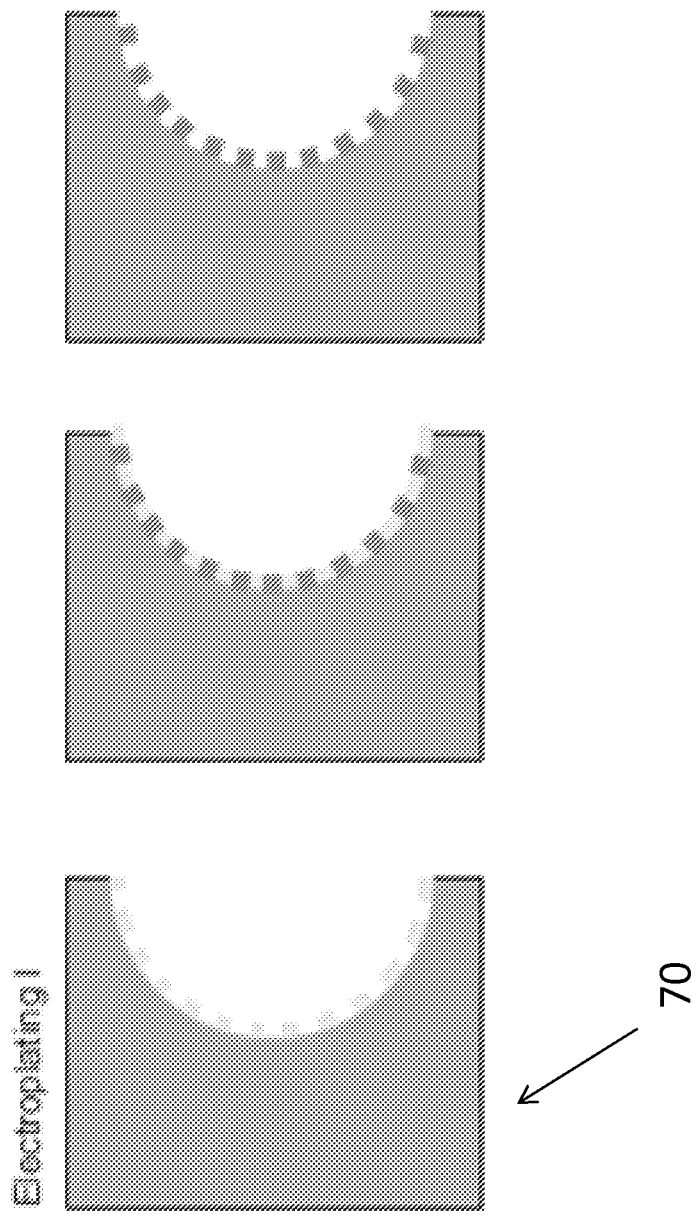

FIG. 10 schematically shows a pattern transfer method where polymer residues are removed and the exposed surface is electroplated with metal. The electroplating is stopped before the thickness of the deposited metal is thicker than the imprint depth. Thereafter, the polymer is removed from the tool/insert 70.

Figure 11:
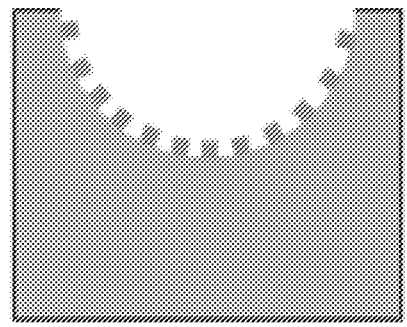
Figure 11:
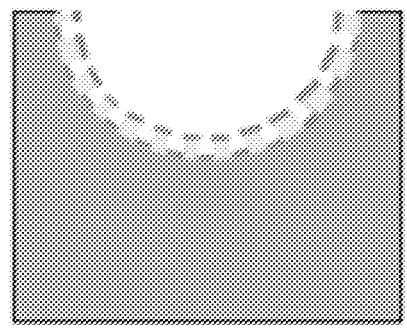
Figure 11:
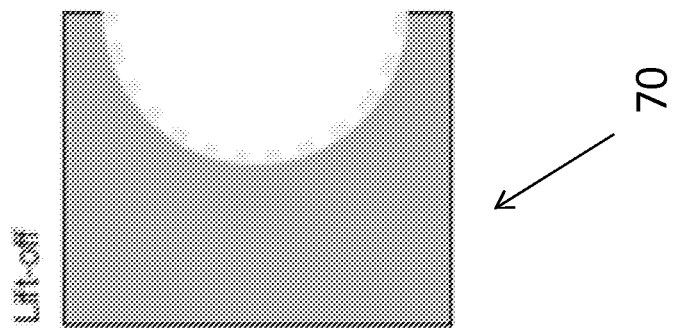

FIG. 11 is a so-called lift-off process similar to the process shown in FIG. 10, but the metal is deposited by evaporation or sputtering or other similar metal deposition techniques. In the lift-off process, the imprinted pattern is processed by removing the resist in the holes and depositing a metal layer in a manner so that the sidewalls of the resist can subsequently be attacked by a dissolving liquid. Thereby, the metal on top of the resist is "lifted off" as it is well-known in the art.

Figure 12:
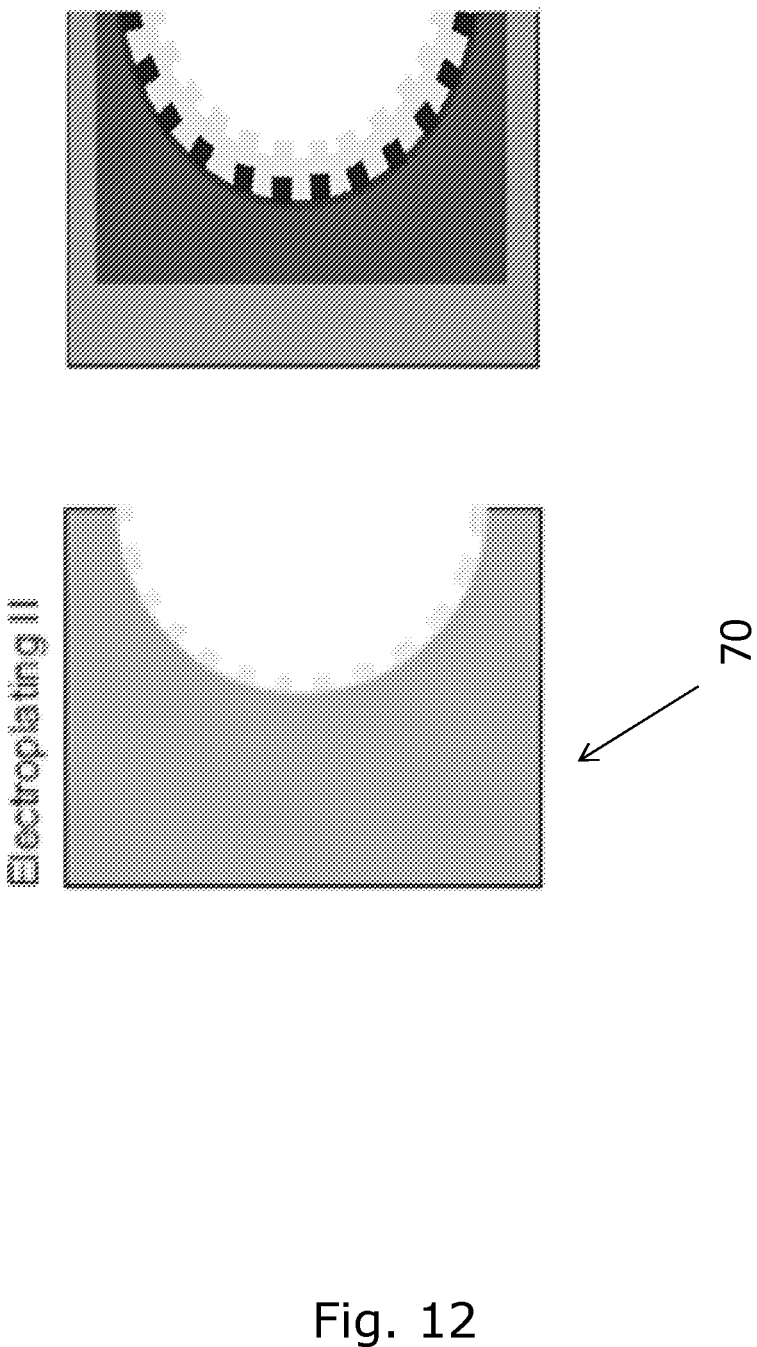

FIG. 12 schematically shows an electroplating method where the imprint is performed into an electrically conducting polymer (or the polymer is made conducting after imprint by e.g. metal sputtering). Electroplating then encapsulates the polymer as indicated in the figure.

Figure 13:
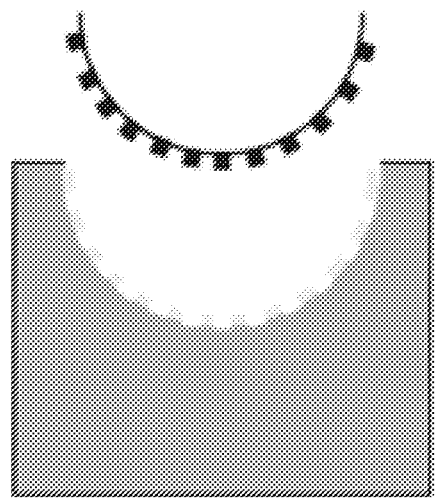
Figure 13:
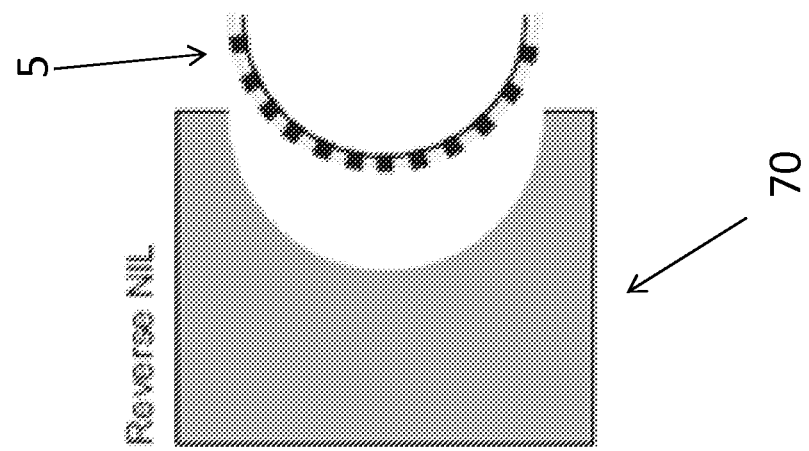

FIG. 13 schematically shows an imprinting method, a so-called reverse nano-lithographic imprinting, where the voids of the imprinting stamp 5 are filled with polymer, or other suitable material, the polymer being placed on the mould surface, where after processing takes place according to any of the method described in connection with FIGS. 10, 11, and/or 12 above.

In other variations of the invention, it is contemplated that shims used in injection moulding can be made by electroplating into a surface-structured tool 70 according to the present invention. It may also be possible to make the shim by electroplating on a flat film which fold or stretch into the appropriate three-dimensional (3D) shape that follows the surface of the tool 70.

Figure 14:
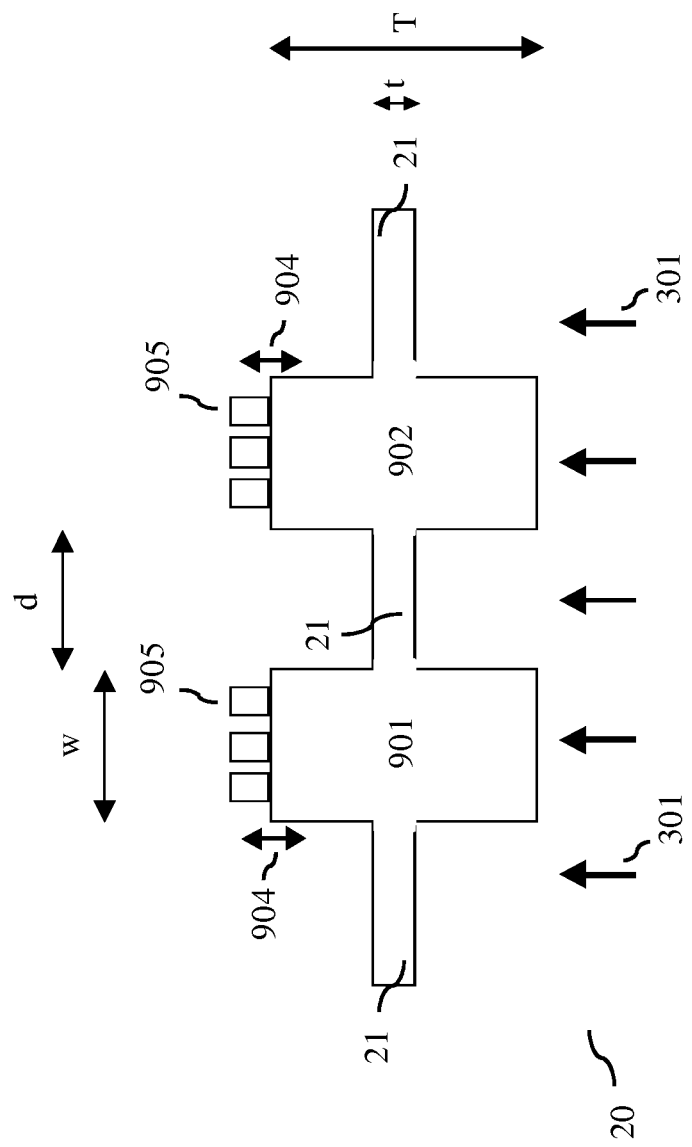

FIG. 14 schematically shows a flexible imprinting member 5 according to the present invention. FIG. 14 shows a cross-sectional view of an embodiment of the nano-imprinting stamp which may function as a member 5. The arrows 301 indicate the direction of imprinting. The imprinting features 905 are positioned on mesa structures. In the embodiment shown, the imprinting sections 904 and 905 are integrated with the base part or member 5. Thus, at the interfaces 21 between the first 904 and second 905 imprinting sections and the base part 5, the first and second imprinting sections are either bonded, e.g. by adhesive bonding, anodic bonding, fusion bonding, etc., to the base part 5, or alternatively the base part 5 and imprinting sections can be manufactured in a single piece of material, as shown here, e.g. a semiconductor material like Si or similar. In this embodiment, the ability of the first and second imprinting sections 904 and 905 to be independently displaceable in a direction substantially parallel to an imprinting direction of the imprinting stamp 1 is assured by an appropriate design of the magnitude of the thickness t of the base part 5 relative to the thickness T of the imprinting sections. Also the width W of the imprinting sections relative to the separation distance d of the imprinting sections should be taken into consideration. The thickness T should be substantially larger than the thickness t so that the thin base part 5 bends locally upwards around an imprinting section 904 or 905 that is displaced relatively upwards due to some kind of imperfection during the imprinting process. Thus, the base part 5 has a membrane-like structure and function making it suitable for functioning as flexible intermediate member 5 within context of the present invention. Further details on this particular kind of flexible nano-imprinting lithography (NIL) stamp can be found in WO 2006/026993, which is hereby incorporated by reference in its entirety.

Figure 15:
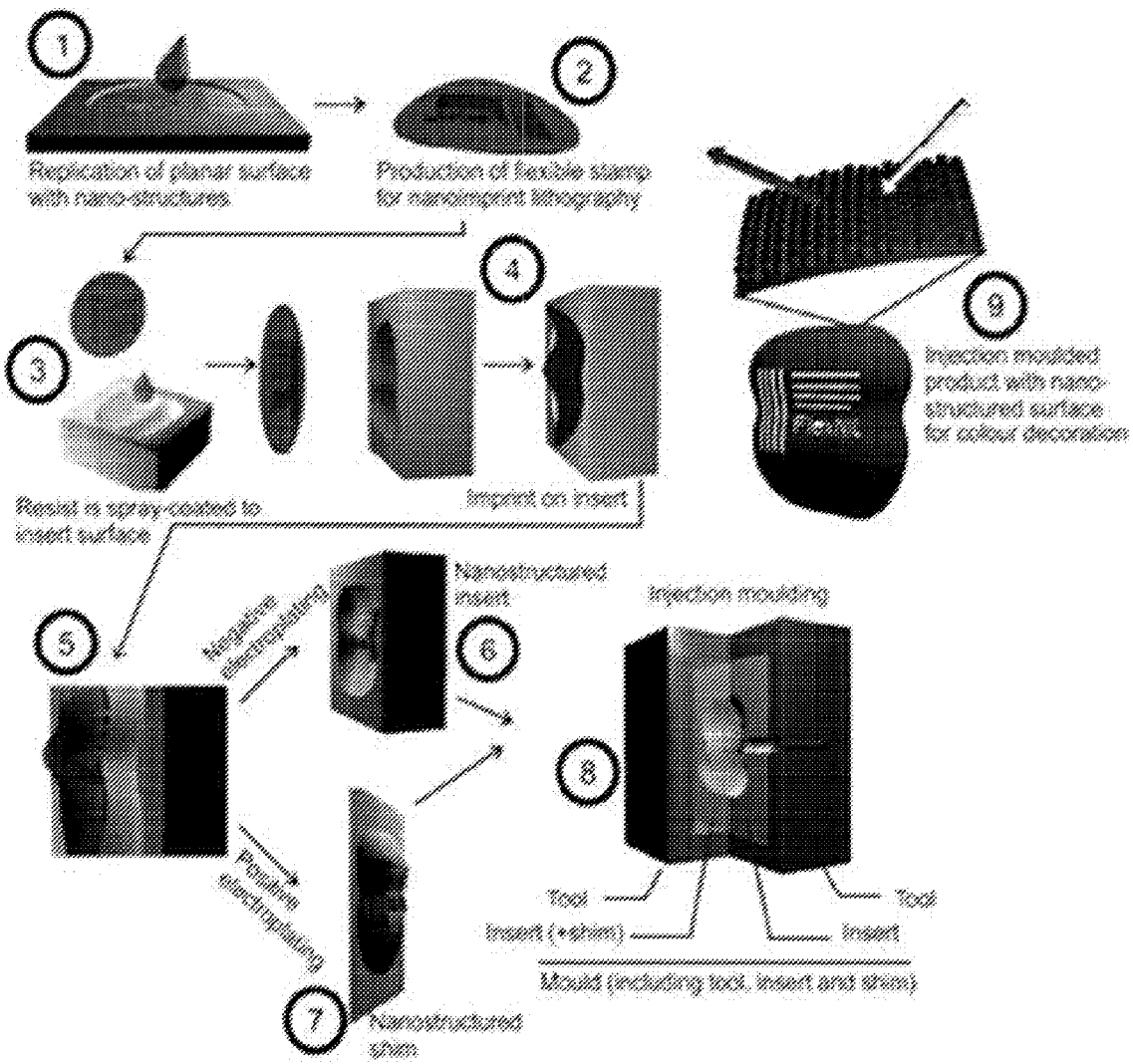

FIG. 15 is a conceptual drawing for an application of the present invention in an insert of an injection moulding form. The invention comprises:

1) A planar micro- and nano-structured master is prepared by conventional micro fabrication techniques.

2) A flexible FlexNIL stamp, e.g. similar to stamp shown in FIG. 14, is made from the original master.

3) The injection moulding tool insert is coated with polymer for nanoimprint lithography by spray-coating.

4) The FlexNIL equipment (not shown) is used to imprint the FlexNIL stamp into the free-form injection moulding tool insert.

5) The nano-structured imprint polymer is prepared for electroplating.

6) The injection moulding tool insert surface is patterned by means of electroplating using the imprinted polymer as masking layer.

7) The imprinted polymer film is used to produce a nano-structured shim be means of electroplating. This first shim (shown) can be replicated into reverse shim copies (not shown) by state-of-the-art electroplating techniques.

8) The nano-structured injection moulding tool or the nano-structured shim is used in a convention injection moulding process.

9) Example of a plastic product functionalized by means of nano-structures.

Figure 16:
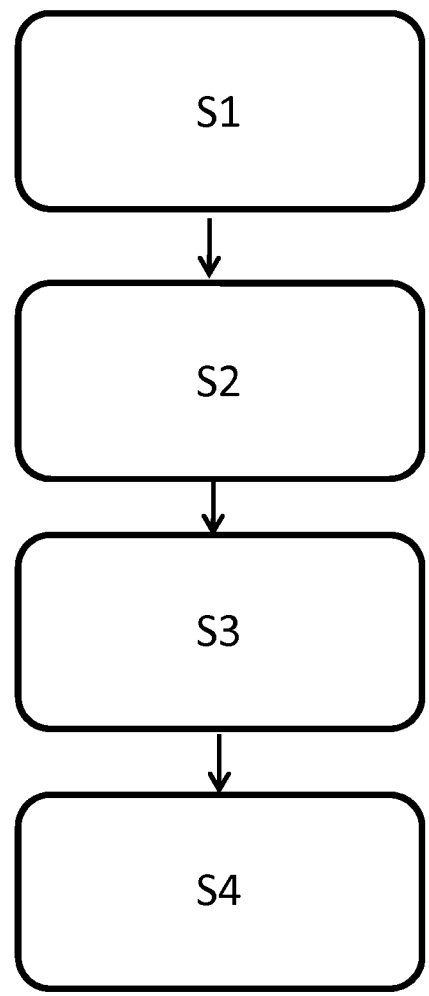

FIG. 16 is a flow chart of a method according to the invention for imprinting a micro/nano-meter pattern in or on an injection molding tool O, the method comprising:

S1 providing an imprinting device 10, the imprinting device comprising a first 1C and a second 2C cavity, the first and the second cavity being separated by a flexible intermediate member 5 within the imprinting device 10, the intermediate member comprising a stamp with a micro/nano imprinting pattern 6, S2 providing an injection molding tool O, S3 positioning the imprinting device 10 on the injection molding tool O so as to form a substantially air-tight enclosure within the second cavity 2C, the enclosure being defined at least by the corresponding injection molding tool surface and the flexible intermediate member 5, and S4 changing the relative pressure between the first 1C and the second 2C cavity so as to cause a decrease in the volume of the second cavity 2C by displacing the flexible intermediate member 5 towards the injection molding tool O surface and thereby imprinting the micro/nano-meter pattern 6 in or on the injection molding tool O.

Figure 17:
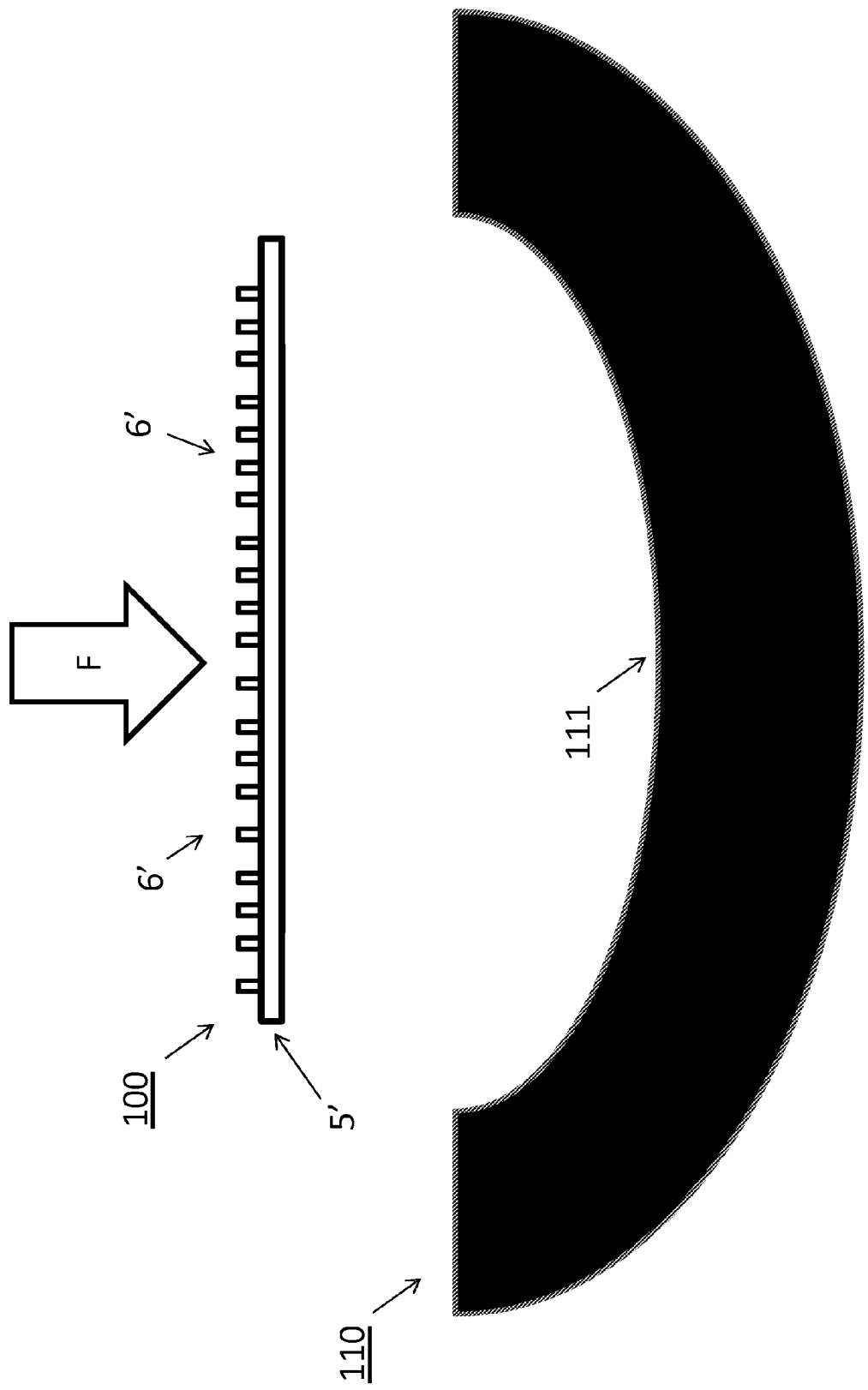
Figure 18:
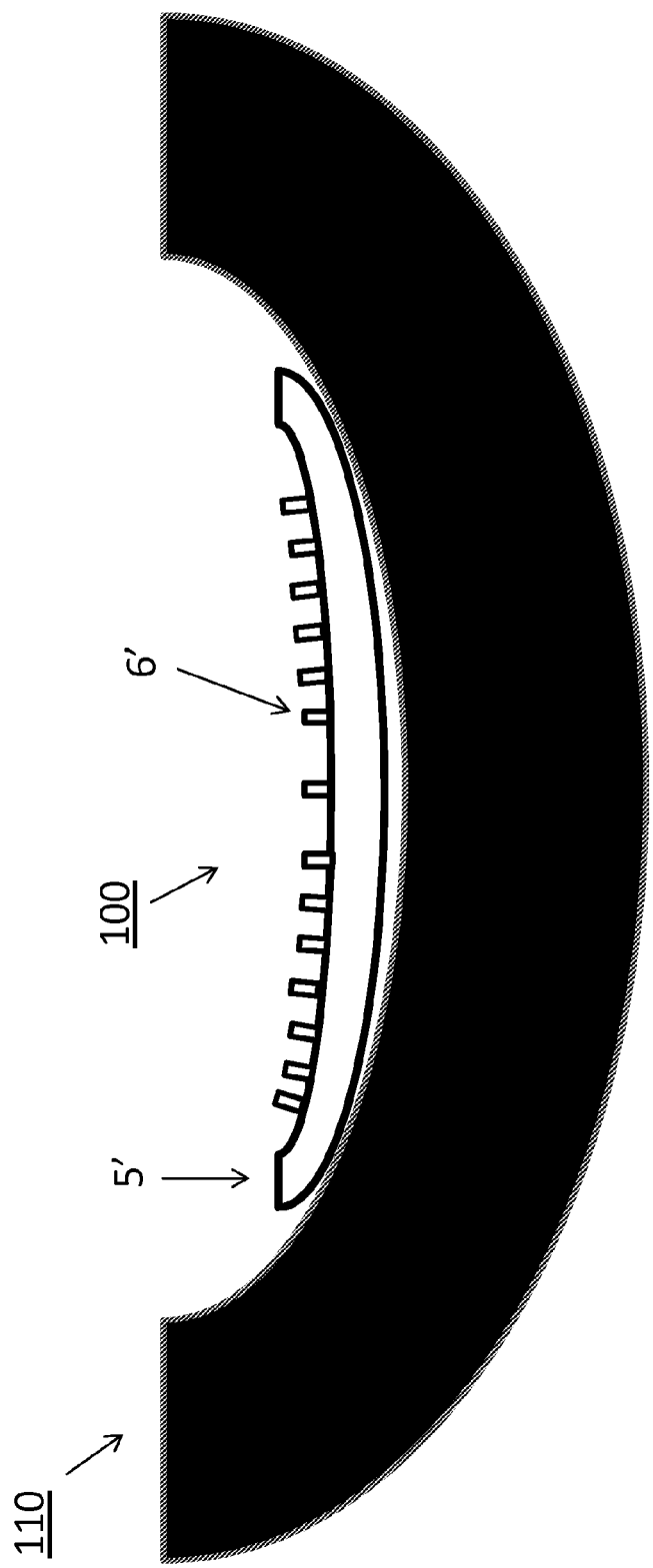
FIGS. 18-21 relates to the second main aspect of the present invention.

FIGS. 17 and 18 are general schematic illustrations according to the second main aspect of the present invention. The invention relates to a method for manufacturing a micro/nano-meter patterned structure in, or on, the active surface of an injection molding tool 110. It should be mentioned that only a portion of the complete molding tool is shown in the figures described below.

Initially, an injection molding tool 110 is provided which has an active surface 111, i.e. a surface facing the part to be molded so that a structured micro/nano-meter sized pattern may be formed in the part. It may be mentioned that the molding parameters, e.g. molding temperature, molding pressure, adhesive energy between pattern and polymer, etc., must be carefully considered in order to obtain a satisfactory nanostructured pattern in the final molded part, cf. On the injection molding of nanostructured polymer surfaces, Pranov et al., Polymer Eng. & Sci., February 2006, 2, p. 160-170, which is hereby incorporated by reference in its entirety.

Further, the invention requires a base plate 100, the base plate having a micro/nanometer structured pattern 6' positioned on an upper part. As explained in connection with FIGS. 7-13 above, the pattern 6' of the plate 100 may be formed by various standard techniques known from nano/micro-meter lithography, including, but not limited to, direct imprinting, electron beam lithography, uv-lithography, laser interference lithography, laser lithography, using a preparation layer, (e.g. a resist) using electroplating, using reverse nanoimprint lithography, etc. It will also be understood that the base plate 100 with the pattern 6 may, depending on the lithographic technique, require additional post processing after insertion into the tool. The base plate 100 consists primarily of a relative thin and substantially uniform material portion 5'.

As indicated schematically in FIG. 17, an effective force F is indicated for providing the required force to displace the base plate 100 toward the active surface 111, the active surface being non-planar on a macroscopic scale. Preferably, the active surface receiving the base plate is curved on a macroscopic scale.

Optionally, the base plate 100 is deformable according to the shape of active surface 111 of the injection molding tool, preferably by plastic deformation. The base plate 100 may be a steel alloy, an aluminum alloy, nickel-alloys, copper alloys, brass alloys, various kinds of glass, etc. suitable for injection molding conditions. Various combinations of these materials may also be contemplated within the context of the present invention.

FIG. 18 schematically shows how the base plate 100 is displaced or positioned into the desired active surface within the tool 110, and how the lower part of the base plate facing the tool, i.e. the pattern is pointing outwards from the mold surface. Subsequently, it is beneficial to secure the position of the base plate 100 within the tool 110, e.g. by micro-welding, glue, or other appropriate attachment means capable of withstanding injection molding conditions.

The displacement may be facilitated by an overpressure, which is provided by an injection molding system (not shown) working in cooperation with the injection molding tool 110, preferably as an injection molding process where the initial molding is used to press the base plate 100 into position, optionally the initial molding process is performed in a manner dedicated to the purpose of this displacement or positioning.

In another variant, the positioning of the base plate 100 is performed by a relative underpressure acting from the side of the lower part of the base plate, a so-called drawing solution where the plate is drawn into or onto the active surface 111. This will also result in an effective force F acting in the shown direction.

Optionally, the positioning of the base plate is assisted by guiding means (not shown), e.g. appropriate rails or pins may be guiding the plate into position when the force F acts on the plate 100.

Figure 19:
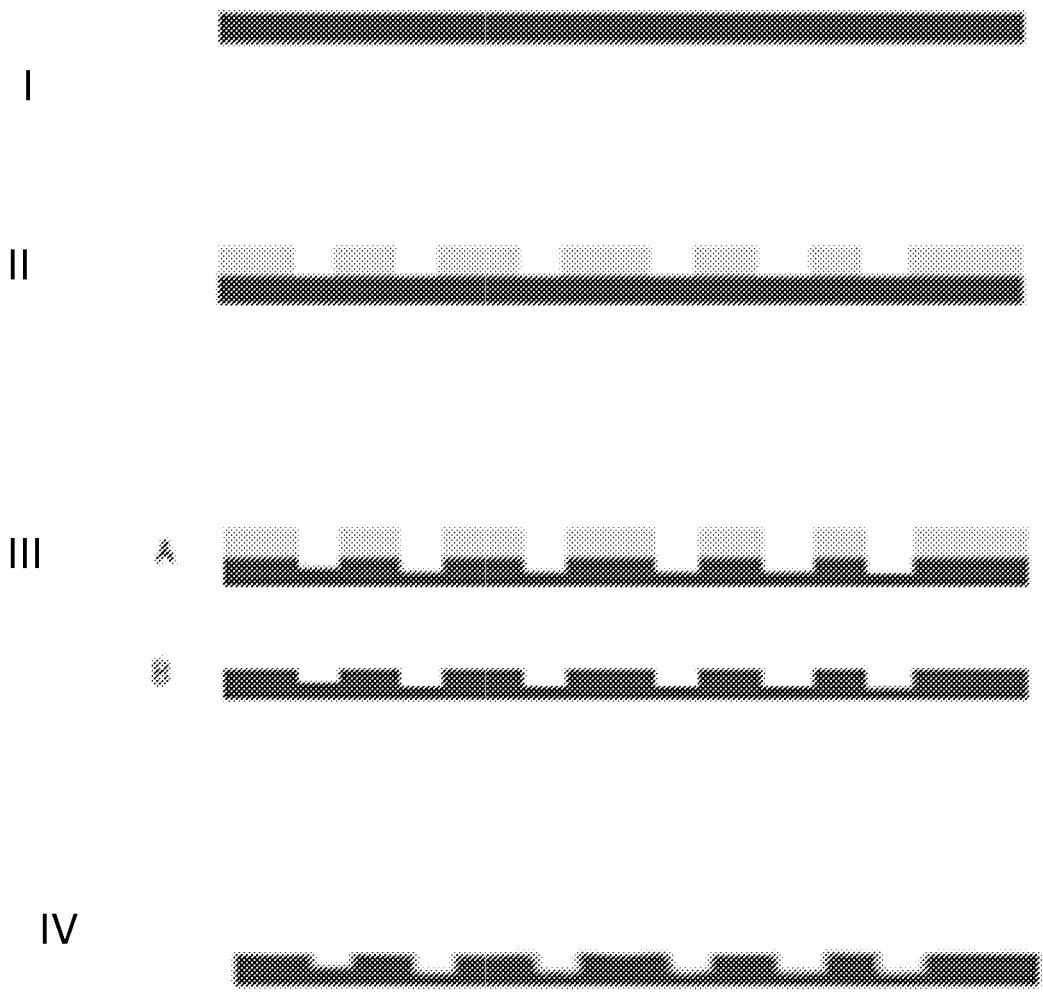
Figure 20:
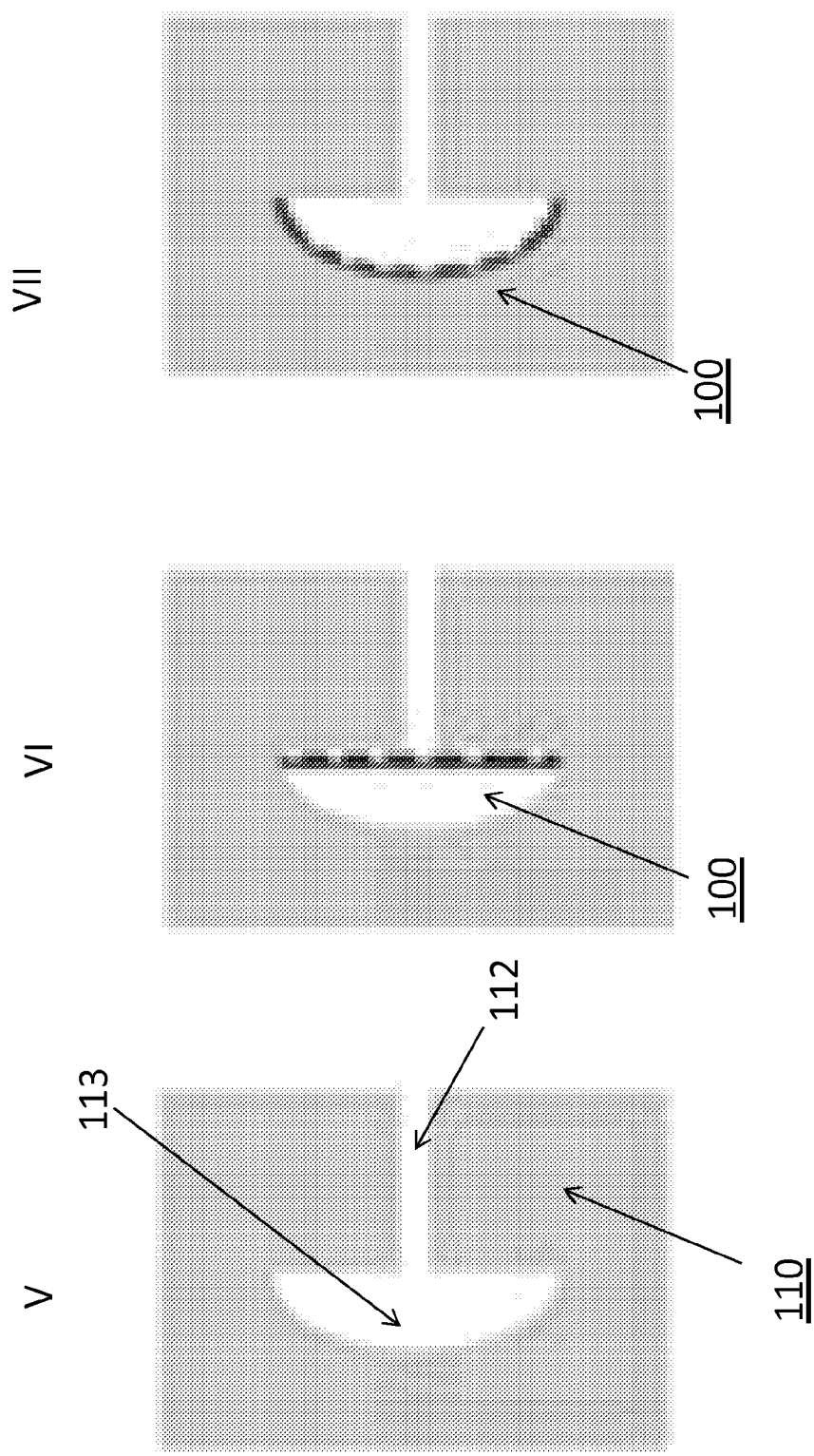

FIGS. 19 and 20 are more specific illustrations of an embodiment according to the present invention.

I:

The starting point of the process is a thin plate of a deformable material e.g. aluminum or steel. This is then polished to obtain a smooth surface for the micro or nano-meter sized structures.

II:

A resist layer is deposited on the plate; this could be done by spin coating. The structures is then defined in the resist with lithography e.g. UV, E-beam, Imprint etc. The resist is then developed leaving the structures in the resist layer.

III:

Two options can be used to define the structures on the insert. 1) Material depositioning such as electroplating 2) etching by either reactive ion etching, wet etching or sputtering. The resist layer is then striped leaving a plate with micro or nano-meter sized structures.

IV:

An insert made of softer materials such as aluminum, cannot withstand as many injection molding cycles as tool steel. The insert therefore require a hard coating to make it more durable. This could be done by chemical vapor deposition (CVD) or physical vapor deposition (PVD), or other similar surface treatment techniques to enhance the durability. As an alternative could the developed resist layer from step II be coated directly, and used for injection molding.

V:

An injection molding tool 110, with the desired freeform cavity 113 and room for the insert is designed and fabricated. The tool has an appropriate conduct 112 for liquid polymer 112 as indicated.

VI:

The plate 110 is bent into the shape of the tool. This is done by placing the plate in the tool. The first polymer injection from the injection molding machine will then act as a hydraulic press, bending the plate 110 into the shape of the tool. Another method might be to beat or physically press the plate 110 into the shape of the tool and then mount it.

VII:

Finally, the actual molding process may be started i.e. repeating injection molding cycles, for the mass production of micro- and nanometer structured free formed parts.

In an alternative process to steel or aluminum (Al, Al-alloys), the process may be performed using nickel (Ni, Ni-alloys):

1. A silicium wafer or glass substrate is coated with a resist being nano/micrometer structured by lithography, cf. step II above.
2. The substrate with resist is used in an electroplating process directly to make Ni pattern, cf. II A above.
3. Alternatively to point 2, the resist is used as a mask to etch the structures into the substrate, and subsequently the resist is removed, cf. III B above. The electroplating may then be performed on the patterned structure left after the resist.

Figure 21:
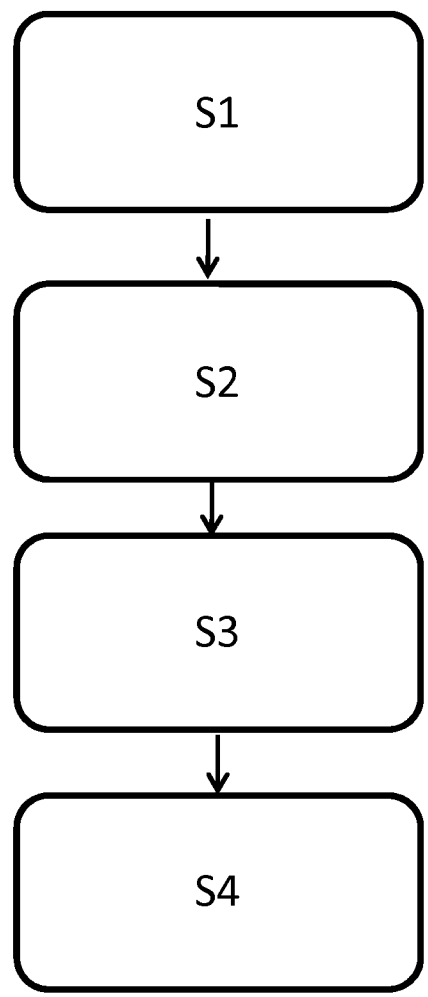

FIG. 21 is a flow chart of a method according to the invention for manufacturing a micro/nano-meter patterned structure in, or on, the active surface of an injection molding tool, the method comprising:

S1 providing a tool;
S2 providing a base plate, the base plate having a micro/nanometer structured pattern positioned on an upper part,
S3 positioning the base plate on the active surface within the tool, the lower part of the base plate facing the tool, and
S4 securing the position of the base plate within the tool, wherein the active surface receiving the base plate is non-planar on a macroscopic scale.

In short, the present invention relates to methods for embedded a micrometer and/or nanometer pattern into an injection molding tool. In a first main aspect, a micro/nanometer structured imprinting device is applied in, or on, an active surface so as to transfer the micro/nanometer patterned structure to the tool while the imprinting device is, at least partly, within a cavity of the injection molding tool. In a second main aspect, a base plate with a micro/nanometer structured pattern positioned on an upper part is positioned on the active surface within the tool, the lower part of the base plate facing the tool, the active surface receiving the base plate being non-planar on a macroscopic scale. Both aspects enable a simple and effective way of transferring the pattern, and the pattern may be transferred on the active working site of tool immediately prior to molding without the need for extensive preparations or remounting of the tool before performing the molding process. This may be illustrated as in FIGS. 1 and 17.

Although the present invention has been described in connection with the specified embodiments, it should not be construed as being in any way limited to the presented examples. The scope of the present invention is set out by the accompanying claim set. In the context of the claims, the terms "comprising" or "comprises" do not exclude other possible elements or steps. Also, the mentioning of references such as "a" or "an" etc. should not be construed as excluding a plurality. The use of reference signs in the claims with respect to elements indicated in the figures shall also not be construed as limiting the scope of the invention. Furthermore, individual features mentioned in different claims, may possibly be advantageously combined, and the mentioning of these features in different claims does not exclude that a combination of features is not possible and advantageous.

| ANNEX 1 |
|---|
| Functionalized surfaces by nanoimprint lithography (NIL) |
| Prior art |
| Friction engineering: |
| Microstructures for reduced drag: U.S. Pat. No.: 20070194178<br>Microstructures in plastic film to be applied onto surface for reduced drag:<br>http://www.highbeam.com/doc/1P3-10991340.html<br>Microstructures in insect wings: Science 325 1549 (2009)<br>Shark skin on plastic film for cars:<br>http://www.zoomilife.com/2009/02/11/skinzwraps-shark-skin-improves-mileage/<br>Skin for aircrafts: U.S. Pat. application No.: 20070138341<br>and U.S. Pat. No.: 6,173,925<br>Shark skin film for drag reduction: CN101372547<br>Shark skin surface created by corrosive means: EP1925779<br>Color decoration by nanostructures: |
| Commonly known that some colors in butterflies comes from structural order<br>inside the scales and not from pigment:<br>http://www.princeton.edu/~pccm/outreach/REU2005/REU2005Presentations/fikse.pdf<br>Injection molding tool patterning: |
| Formation of a planar micro structured surface for insertion in a injection molding<br>tool: EP1422194 (related to the indirectly structuring by NIL)<br>Wind turbine wings |
| Not been able find anything on structured surfaces |

The Invention

The objective here is to make a patent covering our ideas within functionalization of surfaces by use of nanostructures. We strive for creating patents which cover the use of nanoimprint lithography to directly or indirectly create nanostructures on the surface of large objects which benefit from these nanostructures by showing an overall improvement of energy efficiency, reduction of materials needed or add new functionalities to the product.

Directly or indirectly refer to the fact that NIL can be used to structure each aircraft wing or NIL can be used to nanostructure the casting mold from which the aircraft wing is made. When structures are made by NIL indirectly the product will typically be manufactured by injection molding, casting or similar where there exists opportunity to nanostructure the casting mold or injection molding tool. Alternatively NIL (or Roll-to-Roll NIL) can be used to structure plastic films covering for example an aircraft wing.

Preferably we will like to patent the following in a hierarchal manner:
1) Functionality of nanostructures
2) Functionality of nanostructures on a certain object
3) Functionality of nanostructures on a certain object created directly or indirectly by nanoimprint lithography.

Keyword is integration of nanostructures by use of nanoimprint lithography onto the surface of objects.

Main objective of patent is to protect the concept of creating micro and nanostructures through the use of nanoimprint lithography, where the these structures give added functionality and where the objects can be certain things.

An example: We will like to patent the following in a hierarchal manner:
1) Use of nanostructures to reduce solid/liquid interface friction (shark skin structures)
2) Use of nanostructures to reduce solid/liquid interface friction (shark skin structures) on aircraft wings
3) Use of nanostructures to reduce solid/liquid interface friction (shark skin structures) on aircraft wings by use of NIL directly or indirectly*

* Directly or indirectly refer to the fact that NIL can be used to structure each aircraft wing or NIL can be used to nanostructure the casting mold from which the aircraft wing is made. When structures are made by NIL indirectly the product will typically be manufactured by injection molding, casting or similar where there exists opportunity to nanostructure the casting mold or injection molding tool or use of NIL to make molds which structure plastic films covering the above.

Input to the matrix:
1. Functionalities
   Solid/liquid friction decrease or increase (shark skin structures or the opposite)
   Anti-fog properties
   Anti-reflection properties
   Color decoration
   Anti-dirt properties (lotus-effect)
   Iridescent properties
2. End products
   Aircrafts
   Cars
   Ships
   Missiles
   Components of the above
   Wind turbine wings
   All plastic objects
   All glass fiber objects
   Optical elements such as glasses/spectacles and lenses (manufactured of e.g. glass or polymers like polycarbonate (PC) or CR-39 from PPG Optical Products)
3. Method
   Nanoimprint lithography (thermal-NIL, UV-NIL, Roll-2-Roll imprinting/printing, inverse NIL, UV/T-NIL, hot embossing, Laser assisted direct imprint (LADI), FST, NIL-2-GO, etc.)
   Use of the above to structure a mold such as casting mold and injection molding tools 1. Core Aspects of the Invention NIL offer a low cost production technology of creating micro- and nanostructures on a given surface. By using the NIL technology for creation of structures on "new" products, these products can gain performance or functionality. The products exemplified here are: Aircrafts and parts hereof, automobiles (and parts hereof), wings for wind turbines, etc.

2. General Aspect of the Invention Including a Short Description of Existing Solutions The core aspect is to use the full potential of NIL. Today everybody working with NIL is focusing on processes taking place in a clean room and therefore naturally also focuses on using NIL for products made in clean rooms. Many other products can benefit from the use of nanostructures. What we will like to patent is to use NIL for ordered/controlled structuring of surfaces with micro and nanostructures on objects not traditionally being produced in clean rooms (silicon wafer based). We will exploit the Flexible stamp technology (FST) and the NIL-2-GO technology (NILTP003) to be able to improve products through nanostructuring. In short: The patent is addressing the use of NIL.

Micro- and nanostructures can used for color decoration, friction control, anti-fog surfaces, anti-reflection surfaces (same as black color), anti-dirt (lotus effect), iridescent color properties. In all these examples improved efficiency is gained (friction control) or a material saving is achieved (color).

3. Problems or Disadvantages Overcome by the Invention.

Today micro and nanostructures can be placed on/in a surface through paint or by adding a plastic film "carrying" the structures. By imprinting directly into the surface (or into the mold surface which defines the surface topography) the structures can be made directly, in an way which is integratable with the existing production method. Furthermore, NIL is the only way of making large area micro and nanostructures in a production setup. By upscaling the NIL technology from its present state where it is used to structure planar wafers (Silicon, glass, GaAs and similar) the benefit from micro/nano-meter structured surfaces can be achieved.

4. Main Advantage(s) of the Invention or any Benefits from Using the Invention

Direct integration of surface structuring technique in existing production method or as a last add-on step.

5. How to Build an Application or a Product of the Invention as Well as the Use of Such Application or Product The starting point is using the NILTP001 (Flexible Stamp for Nanoimprint lithography) possible combined with NILTP003 (NIL-2-GO tool) and NILTP005 (NIL-2-GO membrane). These techniques allow for NIL on non-planar and curved surfaces and free-formed surfaces. These techniques can be used to either structure moulds for casting or tools used in injection moulding or the technologies can be used to pattern products directly.

6. Who would be the Customer of an Application or Product in Accordance with the Invention?
   Manufactures or end users of
   Aircrafts or parts hereto
   Automobiles or parts hereto
   Missiles
   Wind turbine wings
   Etc.

EXAMPLES OF ANNEX 1

1. A method for manufacturing a micro- and/or nano-meter patterned structure in or on a macroscopic object, the method comprising:
   providing a macroscopic object;
   providing a nano and/or micro-meter structured imprinting stamp having a structure to be imprinted, directly or indirectly, in said object; and
   applying the imprinting stamp in or on the macroscopic object.
2. The method according to example 1, wherein the surface, or part thereof, of the macroscopic object is intentionally non-planar, or curved or free-formed.
3. The method according to example 1 or 2, wherein the imprinting is performed by direct thermal imprinting.
4. The method according to example 1 or 2, wherein the imprinting is performed directly by laser-assisted direct imprinting comprising the use of a transparent surface where through the laser irradiation is applied for heating.
5. The method according to example 1 or 2, wherein the imprinting is performed directly and comprises the use of spray coating a UV sensitive polymer on the object and applying UV irradiation for exposure of the polymer.
6. The method according to example 1 or 2, wherein the imprinting is performed indirectly by imprinting, with the imprinting stamp, in an injection moulding tool or a casting form, and applying the injection moulding tool or casting form to form the micro- and/or nano-meter structure in the object.
7. The method according to any of the preceding examples, wherein the object is, or forms part of, an aircraft (incl. wings), a car, a ship, a missile, a wind turbine wing, a plastic object, a glass fiber object, an optical element, preferably glasses/spectacles, or a watch face.
8. The method according to any of the preceding examples, wherein the micro- and/or nano-meter patterned structure is applied so as to obtain:
   Solid/fluid friction decrease or increase (such as shark skin structures or the opposite);
   Anti-fog properties;
   Anti-reflection properties;
   Color decoration;
   Anti-dirt properties (such as lotus-effect);
   Iridescent properties;
   Or any combination thereof.

ANNEX 2

An Imprinting Method and Device for Imprinting an Object

Field of the Invention

The present invention relates to a method, and a corresponding device, for imprinting a micro/nano-meter pattern in or on an object. The invention also relates to an imprinting system.

Background of the Invention

Micro- and nanostructures on an object can be utilized for modifying the color decoration, friction control, anti-fog surfaces, anti-reflection surfaces (same as black color), anti-dirt (e.g. lotus effect), iridescent color properties, etc. In all these examples improved efficiency is gained (e.g. friction control) or a material optimization is achieved (e.g. no need to color).

Today micro and nanostructures can be placed on/in a surface through paint or by adding a plastic film "carrying" the structures. By imprinting directly into the surface (or indirectly; into a mold surface which defines the surface topography) the structures can be made directly, or indirectly, in a way which is integratable with the existing production methods.

However, progress in the micro/nano imprinting technology has hitherto been focused mainly on essentially planar surfaces such as silicon wafers and related micro-technology. This has limited the application of these imprinting technologies to relatively specialised areas, furthermore, this must typically be performed in specialised clean rooms.

US patent application 2009/0194913 discloses a method for micro/nano imprinting, which applies a soft mold, a pre-shaping sealing film, and soft holder arrangements to the micro/nano structure imprinting process of the curved substrates. The method of the disclosed invention can prevent the curved surface from crumbling, which may result from high gas pressuring, and can obtain uniform imprinting pressure distribution throughout the whole curved substrate. This method may open a range of applications within for non-planar surface nano imprinting, especially suited for various optical elements. However, this method requires a relative complex imprinting device with a bottom holder underneath the substrate having the same shape as the substrate itself. Furthermore, there is a limit to the substrate size because the substrate must be accommodated within the imprinting device and that a vacuum is required. This makes the widespread application of this imprinting device on curved or non-planar substrates rather complicated and cost in-effective. It is further disadvantage that a pre-shaping film must be applied and that apparent only regularly curved (convex or concave) substrates can be imprinted.

Hence, an improved imprinting method would be advantageous, and in particular a more efficient and/or reliable imprinting method would be advantageous.

SUMMARY OF THE INVENTION

It is an object of the present invention to provide an alternative to the prior art. In particular, it may be seen as an object of the present invention to provide a method for imprinting micro/nano-meter pattern in or on an object that solves the above mentioned problems of the prior art with inter alia complex and/or expensive imprinting methods.

Thus, the above described object and several other objects are intended to be obtained in a first aspect of the invention by providing a method for imprinting a micro/nano-meter pattern in or on an object, the method comprising:
   providing an imprinting device, the imprinting device comprising a first and a second cavity, the first and the second cavity being separated by a flexible intermediate member within the imprinting device, the intermediate member comprising a stamp with a micro/nano imprinting pattern,
   providing an object,
   positioning the imprinting device on the object so as to form a substantially air-tight enclosure within the second cavity, the enclosure being defined at least by the corresponding object surface and the flexible intermediate member, and
   changing the relative pressure between the first and the second cavity so as to cause a decrease in the volume of the second cavity by displacing the flexible intermediate member towards the object surface and thereby imprinting the micro/nano-meter pattern in or on the object.

The invention is particularly, but not exclusively, advantageous for providing a method for micro/nano-meter imprinting that enables a simple and effective way of imprinting on non-planar surfaces of objects, especially complex and/or large objects that might not otherwise be imprinted. Especially, the method may be applied on curved surfaces where the flexible intermediate membrane may easily adapt itself to the shape and form of the curved surface under influence of the changing relative pressure between the first and the second cavities.

The present invention may therefore facilitate an outstanding possibility for more wide spread application of micro/nano-meter imprinting methods in areas where such imprinting was not previously technically feasible and/or economically realistic.

In short, the present invention will, to the best belief of the inventors, fundamentally change the way micro/nano-meter imprinting will be performed; with the present invention it is feasible that the imprinting device is positioned on the object to be imprinted, whereas previously the object to be imprinted typically had to be inserted within a relatively complex imprinting device, e.g. US patent application 2009/0194913 discussed above. Thus, in some embodiments, the present invention may be implemented in a hand-held device, optionally with some connected and/or by-standing pressure control system for changing the relative pressure between the first and the second cavities and/or an external device for delivering of energy for softening or hardening the imprint material.

Furthermore, the present invention may facilitate the use of micro/nano-meter imprinting devices under more harsh conditions, e.g. in a workshop or at a production line, because of the robust design of the imprinting device. Previously, micro/nano-meter imprinting often had to be performed in a dedicated laboratory under high-level clean room conditions. Within the area of micro/nano-meter lithography the technical development and progress has primarily been directed towards such clean room applications.

The present invention may additionally facilitate micro/nano-meter imprinting on various complex shapes, not just regularly shaped non-planar shapes and forms like half-spheres, parts of spheres, parts with convex forms, parts with concave forms, thus, the present invention may also use applied for shapes with combinations of such forms and other irregularly shaped forms.

More specifically, the radius of curvature, preferably the maximum value of the radius of curvature, of the object (or the imprinted part thereof) may be is at least 1 mm, preferably at least 10 mm, more preferably at least 50 mm, most preferably at least 100 mm. Alternatively, the radius of curvature, preferably the maximum value of the radius of curvature, of the object (or the imprinted part thereof) may be is at least 1 m, preferably at least 10 m, more preferably at least 100 m.

Thus, the object to be imprinted may be, or forms part of, an aircraft (incl. wings), a car, a ship, a missile, a wind turbine wing, a plastic object, a glass fiber object, or a watch face.

The following non-exhaustive list of applications and/or products may particularly be relevant and advantageous for the present invention:
LEDs
Integrated optics (including photonic band gap structures)
Surface energy engineering
Surface bio compatibility engineering
Cooling
Heat transfer
Automotive
Active and passive optical elements
Displays
Storage (including hard disc and optical)
MEMS
NEMS
Antireflection
Solar cells
Photo Voltaic elements
Batteries
Filter (particle filters, bio filters, water filters, etc.)
TEM Windows
Quantum devices, and
SERS (Surface Enhanced Raman Spectroscopy)

The present invention may particularly be used for imprinting in order to obtain a micro- and/or nano-patterned structure having the following characteristics:
Solid/fluid friction decrease or increase (such as shark skin structures or the opposite);
Anti-fog properties;
Anti-reflection properties;
Color decoration;
Anti-dirt properties (such as lotus-effect);
Iridescent properties;
Or any combination thereof.

In the context of the present invention, it is to be understood that the term "nano/micro-meter imprinting" may relate to imprinting features having dimensions being less than 100 micrometers, preferably less than 50 micrometers, or more preferably less than 25 micrometers.

In one embodiment, the imprinting device may have a container-like form with an open end to be positioned on the object, the open end defining said corresponding object surface.

Preferably, sealing means are provided on a portion of the imprinting device facing the object to be imprinted, the sealing means being arranged for, in combination with the object surface, to provide a substantially air-tight sealing of the said second cavity. This facilitates easier change of the relative pressure between the two cavities.

The changing of the relative pressure between the first and the second cavity, causing a decrease in the volume of the second cavity, also causes a corresponding increase in the volume of the first cavity, thus the volume decrease may equal or substantially equal to the increase in the volume of the first cavity due to the flexibility of the intermediate member.

Advantageously, changing of the relative pressure between the first and the second cavity may be performed by increasing the pressure in the first cavity, and/or decreasing the pressure in the second cavity. Preferably, decreasing the pressure in the second cavity is performed finally, but successive or simultaneous changes of the pressures are also possible.

In one embodiment, the micro/nano-meter pattern may be imprinted directly in the object, i.e. direct lithography, for example direct thermal NIL in object, laser assisted direct imprinting (LADI), etc.

In another embodiment, the micro/nano-meter pattern may be initially imprinted in a preparation layer, the preparation layer subsequently being processed to form the desired pattern, i.e. indirect lithography; where the object has, e.g. a layer of photoresist, a shim, etc.

Preferably, the object may be an injection molding tool or casting form, or part thereof for example inserts etc. See also the above list for various applications and/or characteristics that may beneficially be implemented via a tool or form having a micro/nano pattern according to the present invention.

In a second aspect, the invention relates to an imprinting device for imprinting a micro/nano-meter pattern in or on an associated object, the device comprises:
  a stamp holder comprising a first and a second cavity, and
  a flexible intermediate member separating the first and the second cavity within the imprinting device, the intermediate member comprising a stamp with a micro/nano imprinting pattern,
wherein the device, when being positioning on the object, is capable of forming a substantially air-tight enclosure within the second cavity, the said volume being defined at least by the corresponding object surface and the intermediate member, and
wherein the device is arranged for changing the relative pressure between the first and the second cavity so as to cause a decrease in the volume of the second cavity by displacing the flexible intermediate member towards the object surface and thereby imprinting the micro/nano-meter pattern in or on the object.

The invention according to this aspect is particularly, but not exclusively, advantageous for providing a device for micro/nano-meter imprinting that enables a simple and effective way of imprinting on non-planar surfaces of objects, especially for larger objects. Particularly, for larger objects having a size or maximum dimension of at least 30 cm, at least 60 cm, or at least 100 cm.

Preferably, the flexible intermediate member may be attached to the internal sides of the imprinting device, more preferably along the entire periphery to create an air-tight sealing.

The imprinting device may have a flexible intermediate member which is a polymer membrane, particular for one-time usage. Optionally, the stamp may be formed in or on the polymer membrane. Alternatively or additionally, the stamp may then be attached to the flexible membrane, preferably releasably attached to the membrane, for example a Si stamp mounted on the polymer membrane or a polymer stamp mounted on a Si wafer or membrane.

Advantageously, one or more fluid channels may be provided in the imprinting device for conveying fluid to and/or from the first and/or the second cavity, though the changing of the relative pressure could be e In a beneficial embodiment, the stamp port of the member may comprise first and second imprinting sections being integrated with a base part, wherein the first and the second imprinting sections are mechanically weakly coupled in a direction substantially parallel to an imprinting direction of the stamp. Additionally, the effective bending stiffness of the first and the second imprinting sections may be substantially larger than the effective bending stiffness of the base part in a direction substantially parallel to an imprinting direction of the stamp.

In one embodiment, the first cavity may be positioned above the second cavity when the device is being positioning on the object in order to provide easier displacement of the flexible intermediate member.

In a third aspect, the invention relates to an imprinting system for imprinting a micro/nano-meter pattern in or on an associated object, the system comprising the imprinting device according to the second aspect and further comprising:
- a control unit; and
- an input/output means adapted for connecting the control unit with the device;

wherein the control unit is adapted for controlling the imprinting device via the input/output means according to computer-generated control commands and/or measures of one or more physical properties retrieved from the imprinting device.

The invention according to this aspect is particular, but not exclusively, advantageous in that the imprinting system may be relatively simpler and/or cheaper to manufacture and/or apply than conventional imprinting system hitherto available.

The first, second and third aspect of the present invention may each be combined with any of the other aspects. These and other aspects of the invention will be apparent from and elucidated with reference to the embodiments described hereinafter.

BRIEF DESCRIPTION OF THE FIGURES

The invention will now be described in more detail with regard to the accompanying figures. The figures show one way of implementing the present invention and is not to be construed as being limiting to other possible embodiments falling within the scope of the attached claim set.

FIGS. 1-3 are schematic side-view illustrations showing a preferred embodiment of the invention, FIG. 4 is a schematic drawing of an imprinting device according to the present invention, FIG. 5 shows various embodiments for sealing means according to the present invention, FIG. 6 shows two different flexible intermediate members according to the present invention, FIGS. 7-13 schematically show various embodiments for implementing the present invention in an injection mould form, FIG. 14 schematically shows a flexible imprinting stamp according to the present invention, FIG. 15 is a conceptual drawing for an application of the present invention in an insert of an injection moulding form, and FIG. 16 is a flow chart of a method according to the invention.

DETAILED DESCRIPTION OF AN EMBODIMENT

FIG. 1 is schematic side-view illustration showing a preferred embodiment of the invention i.e. a method for imprinting a micro/nano-meter pattern in or on an object O. The form and structure of the imprinting device 10 is not limited to this particular shape but many different shapes and forms of the container or vessel-like structure 2 may be readily used within the teaching and principle of the invention. In a top-view (i.e. orthogonal to the side view) the imprinting device 10 may be circular, rectangular, quadratic, elliptic, or any desirable form suitable for implementing the invention. The imprinting device 10 may similarly have a non-planar rim depending on the specific surface shape of the object O where the micro/nano meter pattern 6 will be imprinted.

The imprinting device 10 comprises a first cavity 1C and a second cavity 2C, the first and the second cavity being separated by a flexible intermediate member 5 within the imprinting device 10, the intermediate member comprising a stamp, or a stamp portion, with a micro/nano imprinting pattern 6. The imprinting device has a container-like form 2 with an open end to be positioned on the object O, the open end defines a corresponding object surface, cf. FIG. 2.

The imprinting pattern or features 6 are not drawn to scale but are merely shown to indicate the principle of the invention. It should be noted the pattern or features 6 as such may also be positioned on top of protrusions on the stamp or stamp portions, these protrusion are often called mesa structures within micro/nano lithography.

In FIG. 2, the imprinting device 10 is positioned on the object O (either by moving the object O, and/or, equivalently, moving the device 10). The device 10 is positioned on the object O so as to form a substantially air-tight enclosure within the second cavity 2C, the enclosure being defined at least by the corresponding object surface within the cavity 2C and the flexible intermediate member 5, and as shown in embodiment in the Figure; also part of the side walls 10a and 10b of the device 10. In an alternative embodiment, the member 5 may be attached to the lowermost part of the sidewalls 10a and 10b so that the enclosure is defined only be the member 5 and the corresponding object surface.

In FIG. 3, it is illustrated how changing the relative pressure between the first cavity 1C and the second cavity 2C causes a decrease in the volume of the second cavity by displacing the flexible intermediate member 5 towards the surface of object O and thereby imprinting the micro/nano-meter pattern 5 in the object. It should be noted that for various applications the micro/nano-meter pattern 5 may be alternatively be imprinted in a preparation layer (not shown here) on top of the object O, for example a photo resist layer (UV curable or similar), a thermoplastic layer, or any other intermediate layer suitable for transferring a pattern into a object O by surface modifications technologies well-known to the skilled person. Some examples are given in connection with FIGS. 7-13, cf. below.

In FIG. 3, it is apparent the imprinting device forms a stacked structure with the first cavity 1C on top followed by member 5, the second cavity 2C, all three positioned above the object O, though a portion of the object O may extend into the second cavity 2C due to the curved surface of the object O.

From the embodiment shown in FIG. 3, it is also evident that the changing of the relative pressure between the first and the second cavity results in a decrease in the volume of the second cavity 2C, and causes a corresponding increase in the volume of the first cavity 1C because the member 5 is displaced downward for imprint.

The changing of the relative pressure between the first cavity 1C and the second cavity 2C is typically performed by increasing the pressure in the first cavity, and simultaneously decreasing the pressure in the second cavity. Alternatively, the change is implemented by decreasing the pressure in the second cavity 2C last.

The change of relative pressure may be implemented by various pressure changing means readily available and well-known to the skilled person. Thus, in one embodiment pressure changing means may be connected pumps (not shown) but other variants may include changing the volume of the cavities by physical means, e.g. moving sides/wall, integrated pistons, etc. Also integrated volume changing means such as heaters, coolers, chemical reactants capable of increasing or decreasing the gas volume may be implemented within the teaching and principle of the present invention.

In an even further variant of the invention, it is contemplated that the first cavity 1C comprises force providing means or generators that may provide a force on the member 5 and the change in relative pressure may be then be the result of a decreasing pressure in the second cavity 2C. The force provided should thus results in the displacement of the imprinting member 5 to the surface of the object O. Such force providing means or generators may include springs, resilient means (rubber or polymers), actuators (electrical, pneumatic, hydraulic), etc.

FIG. 4 is a schematic drawing of an imprinting device according to the present invention. Changing the relative pressure between the first cavity 1C and the second cavity 2C may be implemented with one or more fluid channels in the imprinting device 10 for conveying fluid to and/or from the first and/or the second cavity. In FIG. 4, one fluid channel is provided for each of the first and the second cavity, channel 40a and channel 40b, respectively. As schematically indicated by double arrows in front of each channel, the channels are used for pumping fluid, i.e. gas or liquid, into and/or out of the first and the second cavities so as to cause a decrease in the volume of the second cavity 2V by displacing the flexible intermediate member 5 towards the object surface and thereby imprinting the micro/nano-meter pattern in or on the object (not shown here).

The fluid flows are controllable from the control unit 45, and optional pressurizing means (e.g. pumps or similar means) may be controlled there from.

The change in the relative pressure should take into account the clearance, i.e. the available vertical displacement, of the flexible member 5 to allow the member to reach the surface of the object. The clearance of the member 5 is related to the mechanical parameters of the member, e.g. the rigidity and the dimensions.

In one special embodiment, there could be just one or more fluid channels into the second cavity 2C. The pressure from above (i.e. from the first cavity) could be set from manufacturing in air-tight enclosure, or alternatively, force providing means or generators could be provided in the first cavity 1C as explained above.

On the lower part of the sides 10a and 10b, sealing means 45a and 45b are provided on a portion of the imprinting device facing the object O to be imprinted, the sealing means 45 being arranged for, in combination with the object surface, to provide sealing of the second cavity 2C to form an air-tight enclosure therein.

FIG. 5 shows various embodiments for sealing means according to the present invention are shown in schematic cross-sectional drawings.

In part A, a resilient portion, e.g. of rubber, is provided on the rim with a half-circular cross-section that may easily adapt to various complex shapes of the object O to be imprinted on.

In part B, a sucking disc is provided on the rim in order to provide firm gripping onto various complex shapes of the object O to be imprinted on.

In part C, a fluid portion is provided on the rim with a half-circular cross-section that may also easily adapt to various complex shapes of the object O to be imprinted on and simultaneous form a substantially airtight enclosure within the second cavity 2C.

FIG. 6 shows two different flexible intermediate members 5 according to the present invention.

The flexible intermediate member 5 is attached to the internal sides of the imprinting device, preferably along the entire periphery to create an air-tight sealing, and therefore appropriate connection or fixation means (not shown) may be present on or in the member 5 and/or on the inside parts of the device 10. The connection or fixation means may be of permanent (many time use) or temporal (single or few time usages) character.

As shown in FIG. 6, upper part, the flexible intermediate member 5 is typically a polymer membrane but could also be made of other flexible materials, e.g. a thin silicon (Si) wafer. The stamp part with the imprinting pattern or features 6 is then formed in or on the polymer membrane 6 as an integral part of the membrane 5.

Alternatively, the stamp 5b is attached to the flexible membrane 5a, preferably releasably attached to the membrane, e.g. a Si stamp 5b can be mounted on the polymer membrane 5a. Alternatively, a polymer stamp 5b can be mounted on a Si membrane or wafer with the required flexibility.

FIGS. 7-13 schematically show various embodiments for implementing the present invention in an injection mould form or casting mould 70, or parts thereof e.g. inserts. For simplicity of the Figures, only the intermediate member 5 is the only part of the imprinting device 10 which is shown.

FIG. 7 shows a so-called direct imprinting where the flexible member 5 of the imprinting device (as mentioned not shown in whole for simplicity) is imprinting directly into a mouldable layer in the form or mould. This may be achieved by heating the relevant surface part of the mould or similar measures. To the right, the pattern is shown in the mould.

FIG. 8 shows a nanoimprint lithographic method where a preparation layer 8 is present, e.g. a polymer being thermoplastic, thermosetting, sol-gel, or UV-curable (requires dedicated UV lamps, not shown). For the thermoplastic and thermosetting layers, heating such as platform heater, infrared heater, high frequency induction heater, UV illuminator, and halogen lamp or other heating means may be provided. The fluids entering the first and/or second cavity may be heated additionally or alternatively.

FIG. 9 schematically shows a pattern transfer method where polymer residues are removed and the pattern is for example etched into the surface of the tool/insert 70.

FIG. 10 schematically shows a pattern transfer method where polymer residues are removed and the exposed surface is electroplated with metal. The electroplating is stopped before the thickness of the deposited metal is thicker than the imprint depth. Thereafter, the polymer is removed from the tool/insert 70.

FIG. 11 is a so-called lift-off process similar to the process shown in FIG. 10, but the metal is deposited by evaporation or sputtering or other similar metal deposition techniques. In the lift-off process, the imprinted pattern is processed by removing the resist in the holes and depositing a metal layer in a manner so that the sidewalls of the resist can subsequently be attacked by a dissolving liquid. Thereby, the metal on top of the resist is "lifted off" as it is well-known in the art.

FIG. 12 schematically shows an electroplating method where the imprint is performed into an electrically conducting polymer (or the polymer is made conducting after imprint by e.g. metal sputtering). Electroplating then encapsulates the polymer as indicated in the figure.

FIG. 13 schematically shows an imprinting method, a so-called reverse nano-lithographic imprinting, where the voids of the imprinting stamp 5 are filled with polymer, or other suitable material, the polymer being placed on the mould surface, where after processing takes place according to any of the method described in connection with FIGS. 10, 11, and/or 12 above.

In other variations of the invention, it is contemplated that shims used in injection moulding can be made by electroplating into a surface-structured tool 70 according to the present invention. It may also be possible to make the shim by electroplating on a flat film which fold or stretch into the appropriate three-dimensional (3D) shape that follows the surface of the tool 70.

FIG. 14 schematically shows a flexible imprinting member 5 according to the present invention. FIG. 14 shows a cross-sectional view of an embodiment of the nano-imprinting stamp which may function as a member 5. The arrows 301 indicates the direction of imprinting. The imprinting features 905 are positioned on mesa structures. In the embodiment shown, the imprinting sections 904 and 905 are integrated with the base part or member 5. Thus, at the interfaces 21 between the first 904 and second 905 imprinting sections and the base part 5, the first and second imprinting sections are either bonded, e.g. by adhesive bonding, anodic bonding, fusion bonding, etc., to the base part 5, or alternatively the base part 5 and imprinting sections can be manufactured in a single piece of material, as shown here, e.g. a semiconductor material like Si or similar. In this embodiment, the ability of the first and second imprinting sections 904 and 905 to be independently displaceable in a direction substantially parallel to an imprinting direction of the imprinting stamp 1 is assured by an appropriate design of the magnitude of the thickness t of the base part 5 relative to the thickness T of the imprinting sections. Also the width W of the imprinting sections relative to the separation distance d of the imprinting sections should be taken into consideration. The thickness T should be substantially larger than the thickness t so that the thin base part 5 bends locally upwards around an imprinting section 904 or 905 that is displaced relatively upwards due to some kind of imperfection during the imprinting process. Thus, the base part 5 has a membrane-like structure and function making it suitable for functioning as flexible intermediate member 5 within context of the present invention. Further details on this particular kind of flexible nano-imprinting lithography (NIL) stamp can be found in WO 2006/026993, which is hereby incorporated by reference in its entirety.

FIG. 15 is a conceptual drawing for an application of the present invention in an insert of an injection moulding form. The invention comprises:

1) A planar micro- and nano-structured master is prepared by conventional micro fabrication techniques.
2) A flexible FlexNIL stamp, e.g. similar to stamp shown in FIG. 14, is made from the original master.
3) The injection moulding tool insert is coated with polymer for nanoimprint lithography by spray-coating.
4) The FlexNIL equipment (not shown) is used to imprint the FlexNIL stamp into the free-form injection moulding tool insert.
5) The nano-structured imprint polymer is prepared for electroplating.
6) The injection moulding tool insert surface is patterned by means of electroplating using the imprinted polymer as masking layer.
7) The imprinted polymer film is used to produce a nano-structured shim be means of electroplating. This first shim (shown) can be replicated into reverse shim copies (not shown) by state-of-the-art electroplating techniques.
8) The nano-structured injection moulding tool or the nano-structured shim is used in a convention injection moulding process.
9) Example of a plastic product functionalized by means of nano-structures.

FIG. 16 is a flow chart of a method according to the invention for imprinting a micro/nano-meter pattern in or on an object O, the method comprising:

S1 providing an imprinting device 10, the imprinting device comprising a first 1C and a second 2C cavity, the first and the second cavity being separated by a flexible intermediate member 5 within the imprinting device 10, the intermediate member comprising a stamp with a micro/nano imprinting pattern 6, S2 providing an object O, S3 positioning the imprinting device 10 on the object O so as to form a substantially air-tight enclosure within the second cavity 2C, the enclosure being defined at least by the corresponding object surface and the flexible intermediate member 5, and S4 changing the relative pressure between the first 1C and the second 2C cavity so as to cause a decrease in the volume of the second cavity 2C by displacing the flexible intermediate member 5 towards the object O surface and thereby imprinting the micro/nano-meter pattern 6 in or on the object O.

Although the present invention has been described in connection with the specified embodiments, it should not be construed as being in any way limited to the presented examples. The scope of the present invention is set out by the accompanying claim set. In the context of the claims, the terms "comprising" or "comprises" do not exclude other possible elements or steps. Also, the mentioning of references such as "a" or "an" etc. should not be construed as excluding a plurality. The use of reference signs in the claims with respect to elements indicated in the figures shall also not be construed as limiting the scope of the invention. Furthermore, individual features mentioned in different claims, may possibly be advantageously combined, and the mentioning of these features in different claims does not exclude that a combination of features is not possible and advantageous.

In short, the present invention relates to a method and device (10) for imprinting a micro/nano-meter pattern in or on an object (O). The imprinting device comprising a first (1C) and a second cavity (2C), the first and the second cavity being separated by a flexible intermediate member (5) within the imprinting device, the intermediate member comprising a stamp with a micro/nano imprinting pattern (6). The imprinting device is placed on the object so as to form a substantially air-tight enclosure within the second cavity and then changing the relative pressure between the first and the second cavity so as to cause a decrease in the volume of the second cavity by displacing the flexible intermediate member towards the object surface and thereby imprinting the micro/nano-meter pattern in or on the object. This enables a simple and effective way of imprinting on non-planar surfaces of objects, especially complex and/or large objects that might not otherwise be imprinted. Especially, this can be applied on curved surfaces where the flexible intermediate membrane may easily adapt itself to the shape and form of the curved surface. As illustrated in FIG. 3.

The invention claimed is:

1. A method for manufacturing a micro/nanometer-structured pattern in, or on, the active surface of an injection molding tool, the method comprising:
   providing the injection molding tool;
   providing a micro/nanometer structured imprinting device having a structure to be imprinted in said tool; and
   applying the imprinting device in, or on, the said active surface so as to transfer the micro/nanometer patterned structure to the tool while the imprinting device is, at least partly, within a cavity of the injection molding tool, the imprinting device being removed before performing the molding process.

2. The method according to claim 1, wherein the active surface being imprinted with the micro/nanometer pattern is non-planar on a macroscopic scale.

3. The method according to claim 1, wherein the active surface being imprinted with the micro/nanometer pattern is curved on a macroscopic scale.

4. The method according to claim 1, wherein the application of the imprinting device is performed when the injection molding tool is in an assembled form, said assembled form being ready for injection molding.

5. The method according to claim 1, wherein the micro/nanometer patterned structure is permanently transferred to the tool.

6. The method according to claim 1, wherein the micro/nanometer pattern is imprinted directly in, or on, the tool.

7. The method according to claim 1, wherein the micro/nanometer pattern is initially imprinted in a preparation layer, the preparation layer subsequently being processed to form the desired pattern.

8. The method according to claim 1, wherein the imprinting device comprises a first and a second cavity, the first and the second cavity being separated by a flexible intermediate member within the imprinting device, and, wherein the intermediate member comprises a stamp with a micro/nanometer imprinting pattern.

9. The method according to claim 8, further comprising
   positioning the imprinting device on the tool so as to form a substantially air-tight enclosure within the second cavity, the enclosure being defined at least by the corresponding tool surface and the flexible intermediate member, and
   changing the relative pressure between the first and the second cavity so as to cause a decrease in the volume of the second cavity by displacing the flexible intermediate member towards the tool surface and thereby imprinting the micro/nano-meter pattern in, or on, the tool.

10. The method according to claim 9, wherein the imprinting device has a container-like form with an open end to be positioned on the tool, the open end defining said corresponding tool surface.

11. The method according to claim 8, wherein a sealing means is provided on a portion of the imprinting device facing the tool to be imprinted, the sealing means being arranged for, in combination with the tool surface, to provide a substantially air-tight sealing of the said second cavity.

* * * * *